(12) United States Patent
Tanada

(10) Patent No.: US 6,909,409 B2
(45) Date of Patent: Jun. 21, 2005

(54) ELECTRONIC DEVICE AND METHOD OF DRIVING THE SAME

(75) Inventor: Yoshifumi Tanada, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 727 days.

(21) Appl. No.: 09/858,627

(22) Filed: May 17, 2001

(65) Prior Publication Data

US 2001/0048106 A1 Dec. 6, 2001

(30) Foreign Application Priority Data

May 18, 2000 (JP) ........................................ 2000-145853

(51) Int. Cl.[7] .............................................. G09G 3/18
(52) U.S. Cl. ............................ 345/51; 345/45; 345/76; 345/87; 345/103
(58) Field of Search ........................... 345/214, 30–111; 341/154; 349/56–69

(56) References Cited

U.S. PATENT DOCUMENTS

| | | | |
|---|---|---|---|
| 5,247,190 A | | 9/1993 | Friend et al. |
| 5,399,502 A | | 3/1995 | Friend et al. |
| 5,414,443 A | * | 5/1995 | Kanatani et al. .............. 345/95 |
| 5,945,972 A | * | 8/1999 | Okumura et al. ............. 345/98 |
| 6,160,533 A | * | 12/2000 | Tamai et al. ................... 345/89 |
| 6,373,419 B1 | * | 4/2002 | Nakao ......................... 341/154 |
| 6,426,744 B2 | * | 7/2002 | Hashimoto et al. ......... 345/214 |
| 6,441,763 B1 | * | 8/2002 | Nakao ......................... 341/154 |
| 6,462,723 B1 | * | 10/2002 | Yamazaki et al. ............. 345/82 |
| 6,545,656 B1 | * | 4/2003 | Yamazaki .................... 345/94 |

FOREIGN PATENT DOCUMENTS

WO WO90/13148 11/1990

OTHER PUBLICATIONS

Herman Schenk et al., "Polymers for Light Emitting Diodes", EuroDisplay '99 Proceedings, pp. 33–37; Sep. 6–9, 1999.
Tsutsui et al., "Electroluminescence in Organic Thin Films", Photochemical Processes in Organized Molecular Systems, pp. 437–450, (1991).
M. A. Baldo et al., "Highly Efficient Phosphorescent Emission from Organic Electroluminescent Devices", Nature vol. 395, pp. 151–154, (Sep. 10, 1998).
M. A. Baldo et al., "Very High–Efficiency Green Organic Light–Emitting Devices Based on Electrophosphorescence", Applied Physics Letters vol. 75, No. 1, pp. 4–6, (Jul. 5, 1999).
Tsutsui et al., "High Quantum Efficiency in Organic Light–Emitting Devices with Iridium–Comolex As A triplet Emissive Center", Japanese Journal of Applied Physics vol. 38, Part 12B, pp. L1502–L1504, (Dec. 15, 1999).
Japanese Patent Application Laid–Open No. 10–92576 (English Abstract).

* cited by examiner

Primary Examiner—Sumati Lefkowitz
Assistant Examiner—Srilakshmi K. Kumar
(74) Attorney, Agent, or Firm—Fish & Richardson P.C.

(57) ABSTRACT

An electro-optical device with a pixel portion of enhanced definition is provided, which uses pixels having a novel structure so that the number of stages of a source signal line side driver circuit is reduced to half the number of pixels in the horizontal direction, thereby making a space for placing the driver circuit and increasing the aperture ratio. One horizontal period is divided into the former half and the latter half. Signals for two adjacent pixels are successively inputted to one source signal line. A pixel selecting portion is provided between the two adjacent pixels. The signal selecting portion selects one of the pixels in the former half of one horizontal period so that a signal is written in the pixel whereas it selects the other pixel during the latter half of the horizontal period so that a signal is written in the pixel. Since one source signal line is shared between two adjacent pixels, the invention is advantageous also in terms of aperture ratio.

20 Claims, 24 Drawing Sheets

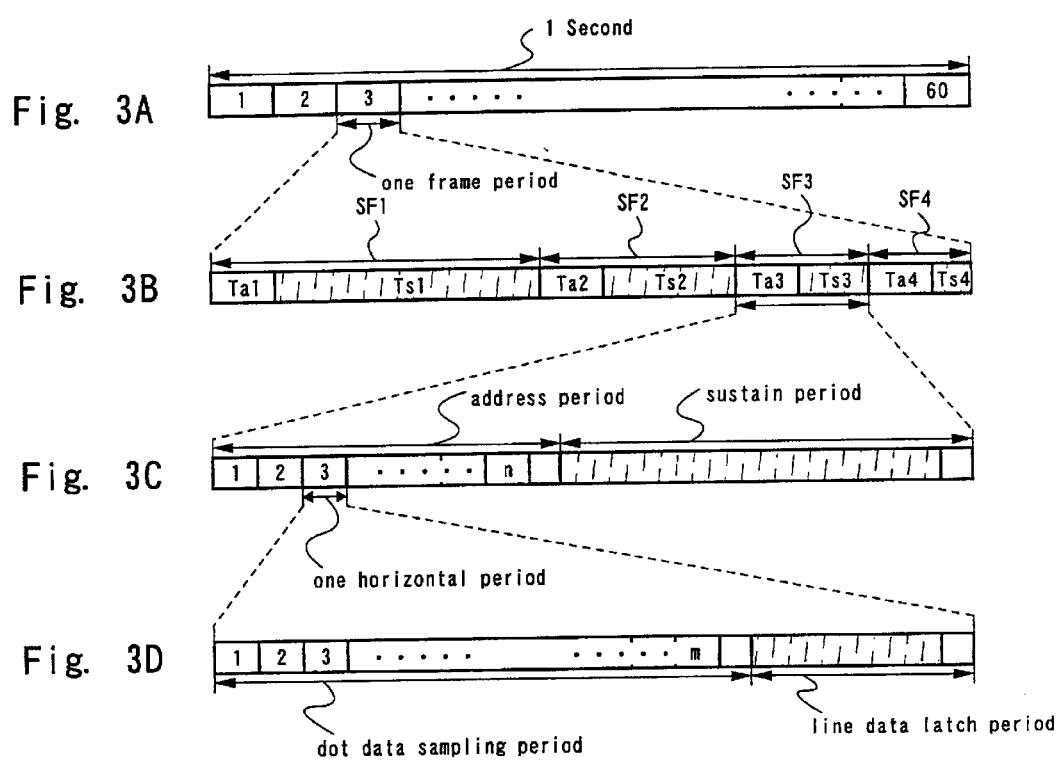

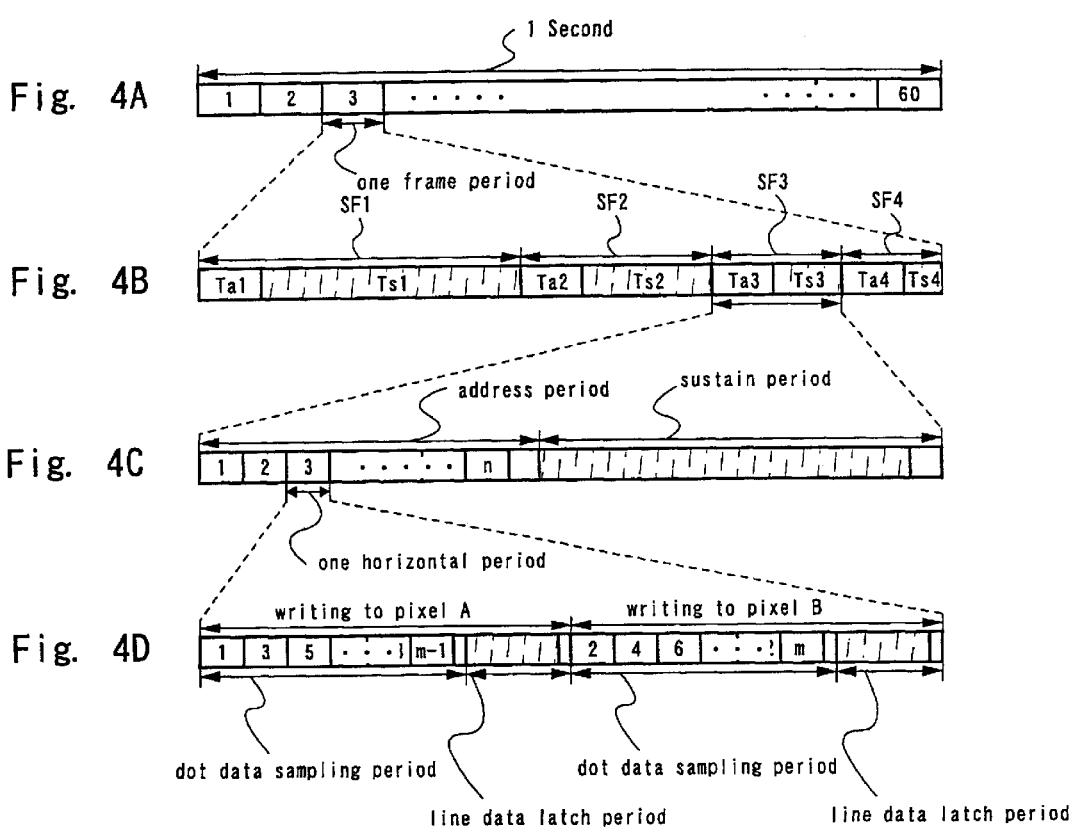

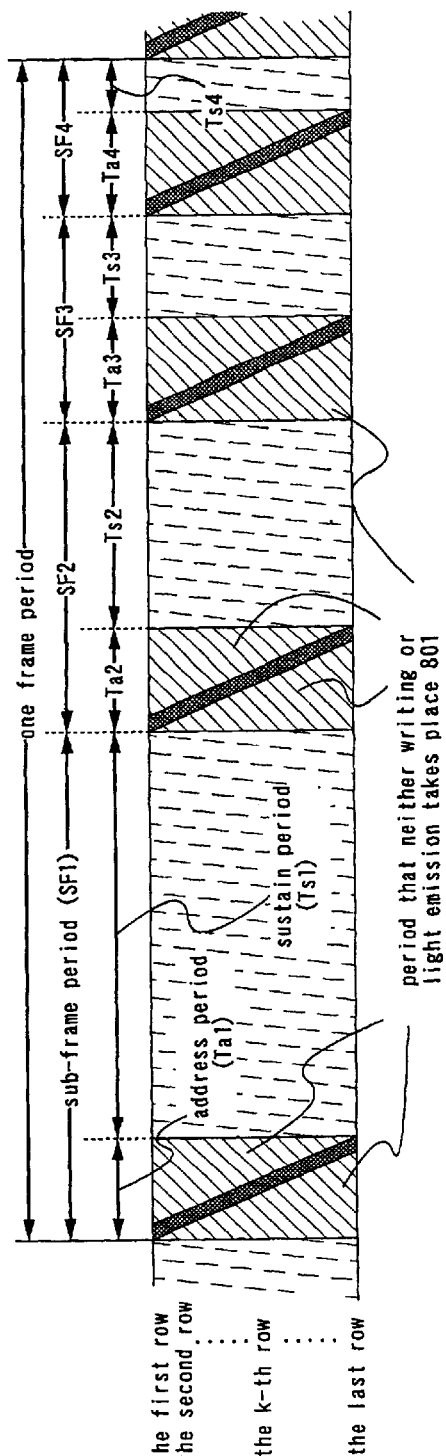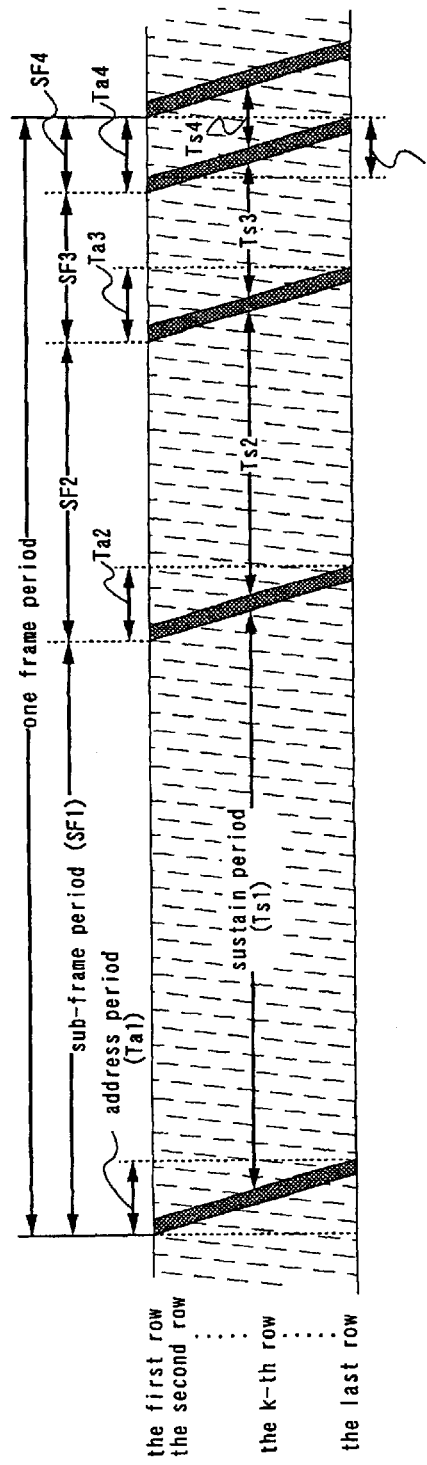

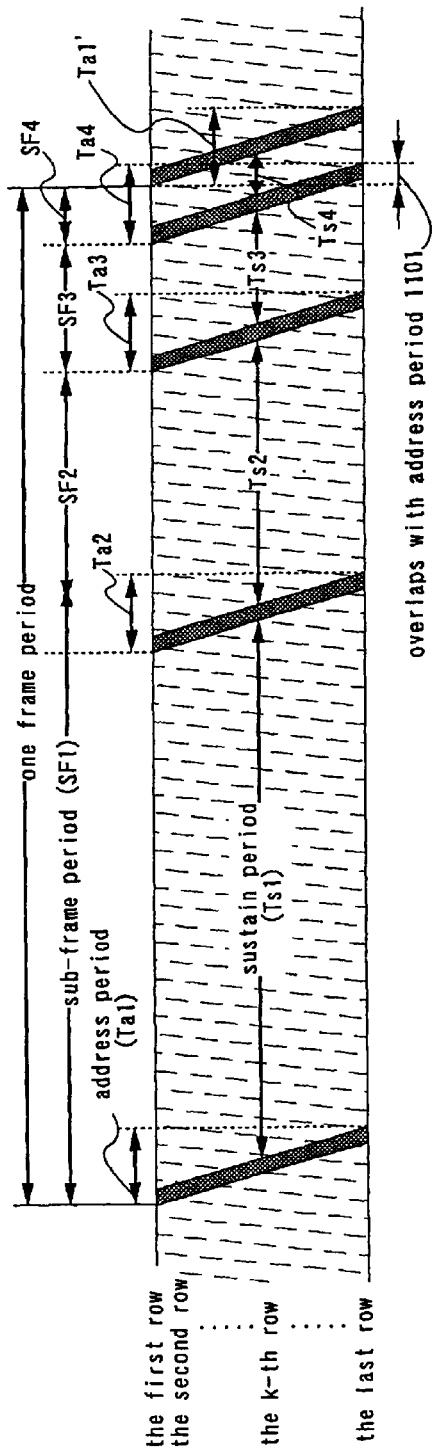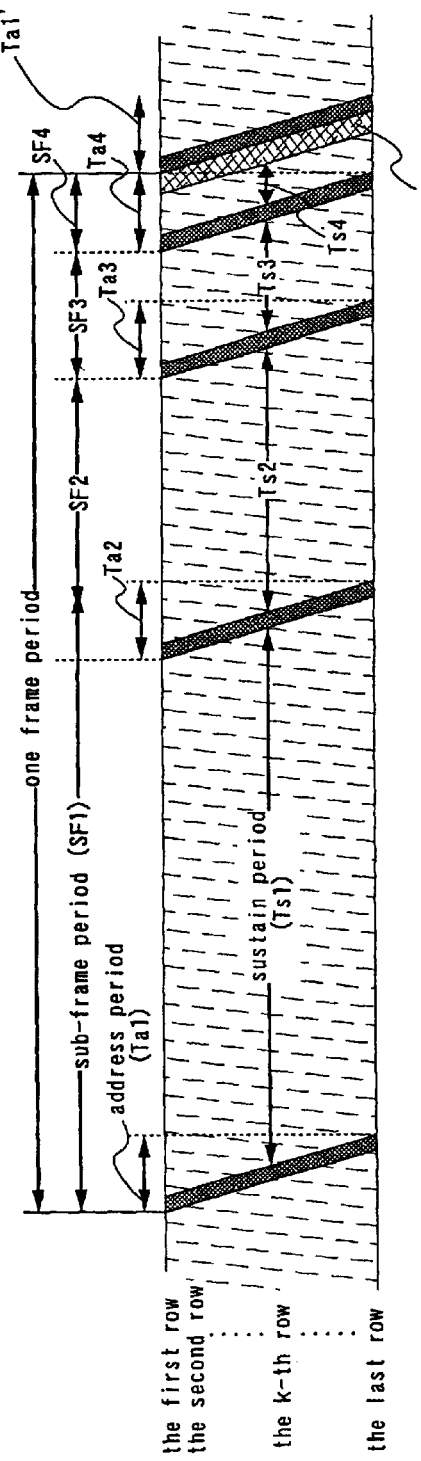
Fig. 11A
Fig. 11B

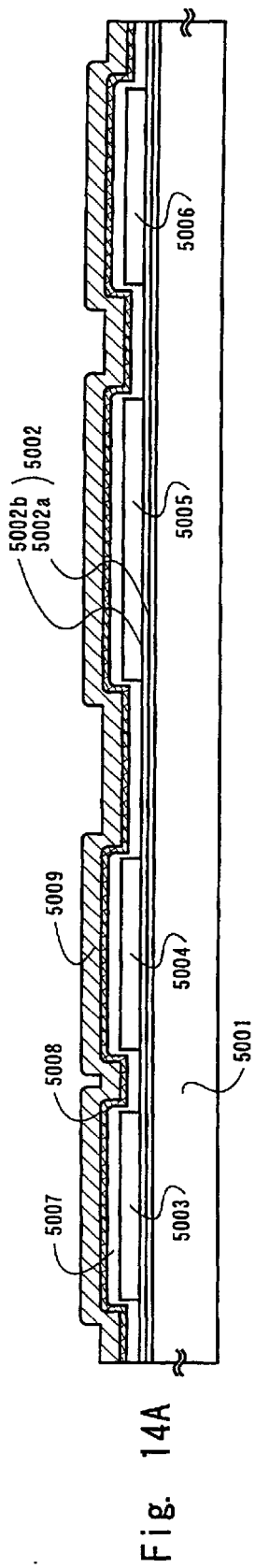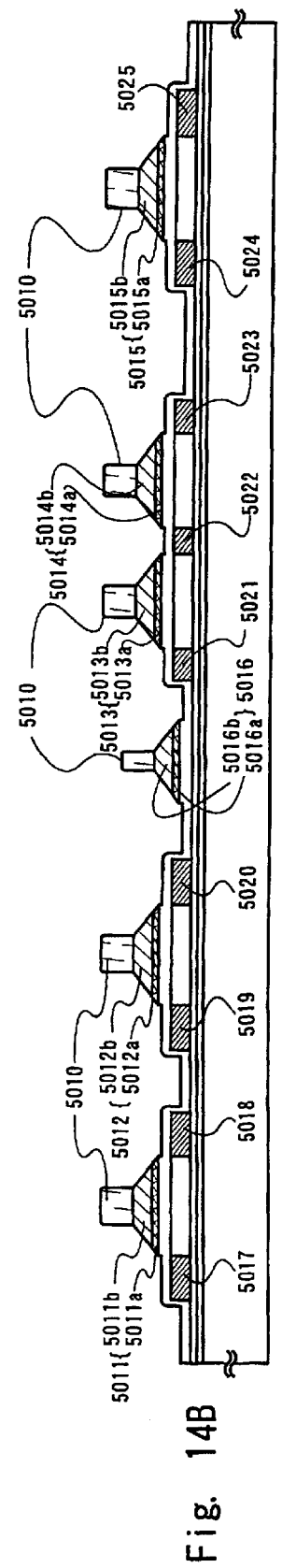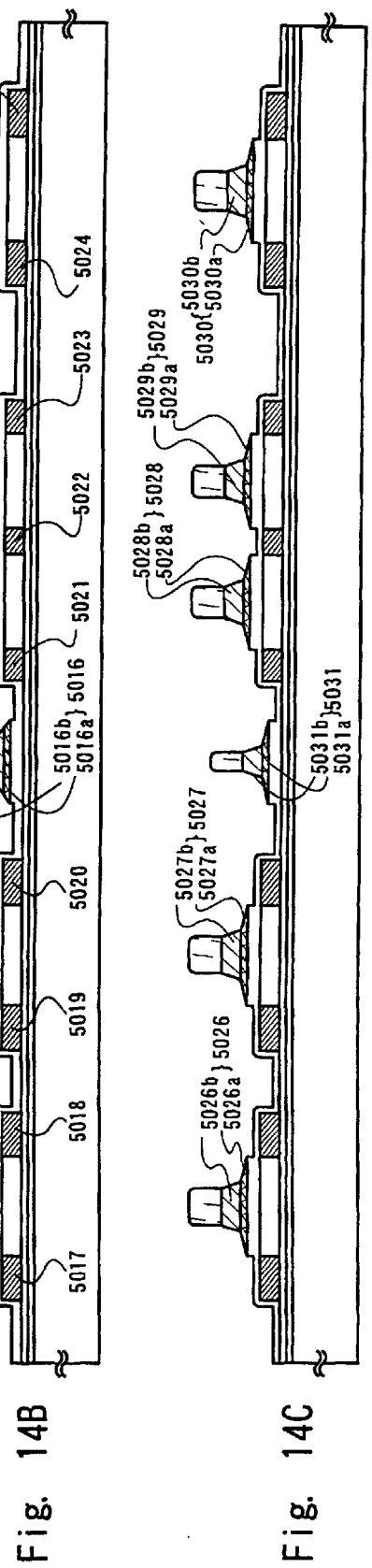

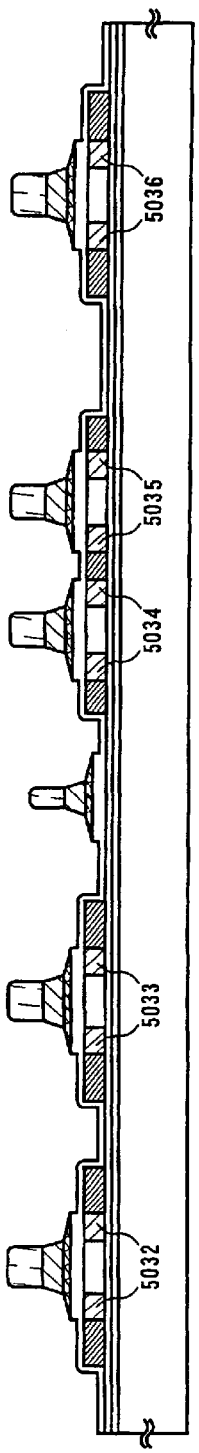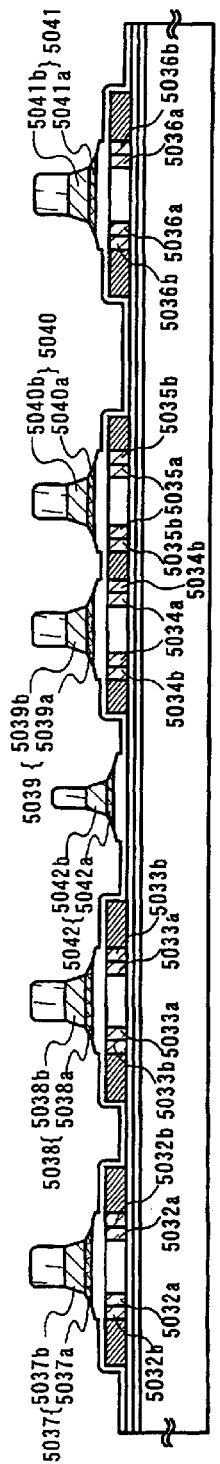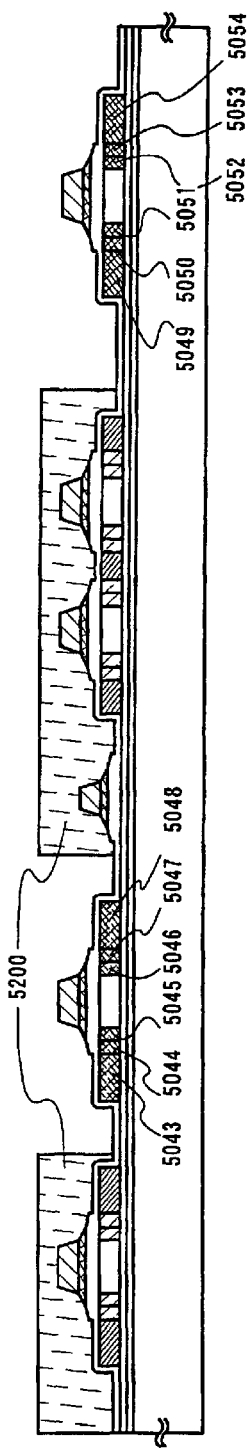

ELECTRONIC DEVICE AND METHOD OF DRIVING THE SAME

BACKGROUND OF THE INVENTION

1. Field of the Invention

The present invention relates to the construction of an electronic device. The present invention particularly relates to an active matrix type electronic device having a thin film transistor (TFT) manufactured on an insulating body and a driving method of the active matrix type electronic device.

2. Description of the Related Art

In recent years, an EL (electroluminescence) display has been attracting attentions as a flat panel display that is to replace an LCD (liquid crystal display), and is actively researched.

There are generally two types of driving systems for the LCD. One type is a passive matrix type used in an STN-LCD, etc. The other type is an active matrix type used in a TFT-LCD, etc. Similarly, there are generally two kinds of driving systems in the EL display. One type is a passive matrix type, and the other type is an active matrix type.

In the case of the passive matrix type, wiring to serve as an electrode is arranged in each of upper and lower portions of an EL element. A voltage is sequentially applied to the wirings, and an electric current flows through the EL element so that the EL element is lighted. On the other hand, in the case of the active matrix type, each pixel has a TFT, and a signal can be held within each pixel.

FIG. 21 shows an example of the structure of an active matrix type electronic device by digital driving. A pixel portion 2101 is arranged in the center. In the periphery of the pixel portion 2101, a source signal line side driver circuit 2102 is arranged to control source signal lines, and a gate signal line side driver circuit 2106 is arranged to control gate signal lines. In FIG. 21, the gate signal line side driver circuit 2106 is provided only on one side of the pixel portion 2101. However, considering operation efficiency and reliability in actual driving, it is desirable to arrange the driver circuits on both sides so as to sandwich the pixel portion 2101. Further, a power supply portion for supplying electric current to EL elements is connected to respective current supply lines of the pixel portion 2101.

The EL element is comprised of an anode, a cathode, and a layer containing an organic compound that provides electro luminescence (luminescence generated by applying electric field) (the layer hereinafter referred to as an EL layer). The luminescence from an organic compound can be divided into light emission upon returning from singlet excitation to the base state (fluorescence) and light emission upon returning from triplet excitation to the base state (phosphorescence). Both kinds of light emission can be used in electronic devices to which the present invention is applicable.

The EL layer defined herein includes all the layers that are provided between an anode and a cathode through this specification. Specifically, the EL layer is comprised of a light emitting layer, a hole injecting layer, an electron injecting layer, a hole transporting layer, an electron transporting layer, and some other layers. The basic structure of an El element is a laminate in which an anode, a light emitting layer and a cathode are sequentially layered. Other types of EL layer structure are a laminate in which an anode, a hole injecting layer, a light emitting layer and a cathode are sequentially layered, and a laminate in which an anode, a hole injecting layer, a light emitting layer, an electron transporting layer and a cathode are sequentially layered.

In this specification, the EL element refers to an element composed of an anode, an EL layer and a cathode.

The source signal line side driver circuit 2102 has a shift register 2103, a first latch circuit 2104 and a second latch circuit 2105. The shift register 2103 receives input of a source side clock signal (S-CLK) and a source side start pulse (S-SP). The first latch circuit 2104 receives input of a digital image signal (digital data). The second latch circuit 2105 receives input of a latch pulse.

The gate signal line side driver circuit 2106 has a shift register (not shown). The shift register receives input of a gate side clock signal (G-CLK) and a gate side start pulse (G-SP).

Drive of the circuits will be described. Reference symbols in FIG. 21 will be used in the description.

In the source signal line side driver circuit 2102, a source side clock signal (S-CLK) and a source side start pulse (S-SP) are inputted to the shift register 2103. The shift register 2103 outputs pulses successively in response to these inputted signals. The pulses successively outputted from the shift register are inputted through a buffer and other circuits (not shown) to the first latch circuit 2104, so that digital image signals (digital data) are successively held (latched) at the respective stages. Upon completion of storing the data at the last stage of the first latch circuit 2104, latch pulses are inputted to the second latch circuit 2105. Then the data that have been held in the first latch circuit 2104 are transferred all at once to the second latch circuit 2105 through a buffer and other circuits (not shown).

In the gate signal line side driver circuit 2106, a gate side clock signal (G-CLK) and a gate side start pulse (G-SP) are inputted to the shift register (not shown). The shift register outputs pulses successively in response to these inputted signals. The pulses pass through a buffer and other circuits (not shown) and are successively outputted as gate signal line selecting pulses to sequentially select gate signal lines.

The data transferred to the second latch circuit 2105 of the source signal line side driver circuit 2102 are written in pixels on the row selected by the gate signal line selecting pulse. This operation is repeated to display an image.

A description given next is on drive of the pixel portion. FIGS. 22A and 22B show a part of the pixel portion 2101 of FIG. 21. FIG. 22A shows a matrix consisting of 3×3 pixels. A section defined by a dotted line frame 2200 is one pixel and an enlarged view thereof is shown in FIG. 22B. In FIG. 22B, reference symbol 2201 denotes a TFT functioning as a switching element when a signal is written in a pixel (hereinafter referred to as switching TFT). The switching TFT 2201 may have the polarity of either an n-channel TFT or a p-channel TFT. Reference symbol 2202 denotes a TFT functioning as an element for controlling a current supplied to an EL element 2203 (current controlling element) (the TFT will be called an EL driver TFT). If a p-channel TFT is used for the EL driver TFT 2202, the TFT is placed between an anode 2209 of the EL element 2203 and a current supply line 2207. If an n-channel TFT is used for the EL driver TFT 2202, on the other hand, the TFT is placed between a cathode 2210 of the EL element 2203 and a cathode electrode 2208. However, because of preference to source grounding in light of TFT behavior and limitations in manufacture of the EL element 2203, a general and frequently employed method is to use a p-channel TFT for the EL driver TFT 2202 and place the EL driver TFT 2202 between the anode 2209 of the EL element 2203 and the current supply line 2207. Reference symbol 2204 denotes a storage capacitor for storing a signal (voltage) inputted from a source signal line 2206. In FIG. 22B, one of terminals of the storage capacitor 2204 is connected to the current supply line 2207. However, it may be connected to an exclusive wiring. The switching TFT 2201 has a gate electrode connected to a gate signal line 2205, and has a source region connected to the source signal line 2206.

An operation of the circuit of the active matrix type electronic device will next be explained with reference to FIGS. 22A and 22B. First, when the gate signal line 2205 is selected, a voltage is applied to a gate electrode of the switching TFT 2201, and the switching TFT 2201 attains a turned-ON state. Then, a signal (voltage) of the source signal line 2206 is accumulated in the storage capacitor 2204. The voltage of the storage capacitor 1504 becomes a voltage $V_{GS}$ between the gate and the source of the EL driver TFT 2202 so that an electric current according to the voltage of the storage capacitor 2204 flows through the EL driver TFT 2202 and the EL element 2203. As a result, the EL element 2203 is lighted.

Luminance of the EL element 2203, i.e., an electric current amount flowing through the EL element 2203 can be controlled by $V_{GS}$ of the EL driver TFT 2202. $V_{GS}$ is the voltage of the storage capacitor 2204, and is a signal (voltage) inputted to the source signal line 2206. Namely, the luminance of the EL element 2203 is controlled by controlling the signal (voltage) inputted to the source signal line 2206. Finally, the gate signal line 2205 is set to a non-selected state, and the gate of the switching TFT 2201 is closed, and the switching TFT 2201 is set to a turned-OFF state. At that time, electric charges accumulated in the storage capacitor 2204 are held. Accordingly, $V_{GS}$ of the EL driver TFT 2202 is held as it is, and an electric current according to $V_{GS}$ continuously flows through the EL driver TFT 2202 and the EL element 2203.

Driving of an EL element etc. are reported in SID99 Digest: P372: "Current Status and future of Light-Emitting Polymer Display Driven by Poly-Si TFT", ASIA DISPLAY 98: P217: "High Resolution Light Emitting Polymer Display Driven by Low Temperature Polysilicon Thin Film Transistor with Integrated Driver", Euro Display99 Late News: P27: "3.8 Green OLED with Low Temperature Poly-Si TFT", etc.

EL displays of late are required to have higher definition as well as to be equipped with a larger screen. However, enhancing the definition of the pixel portion by reducing the pixel pitch raises a problem of insufficient space for placing a driver circuit. For instance, if the definition is to be improved from VGA to XGA without changing the size of the panel, the pixels in the horizontal direction are increased in number from 640 pixels to 1024 pixels. The width of one pixel in this case is reduced to 62.5%, and hence the width for placing one stage of a source signal line side driver circuit is also reduced to 62.5%.

In order to solve the problem above, the driver circuit has to be further reduced in size. However, this is not so easy a solution to carry out when taking into consideration rules in designing, reliability in circuit behavior, yield, etc.

SUMMARY OF THE INVENTION

The present invention has been made in view of the above, and an object of the present invention is therefore to provide an electronic device in which pixels having a novel structure are used to obtain higher definition while avoiding the above-mentioned problem of lack of space for placing a driver circuit.

The present invention takes the following measures to attain the above object.

As shown in FIG. 22B, ordinary pixels each have one source signal line 2206, one gate signal line 2205 and one current supply line 2207. According to the pixel structure in an electronic device of the present invention, one source signal line 110 is provided between two adjacent pixels so that a pixel A and a pixel B share the one source signal line as shown in FIGS. 1A and 1B. However, this structure needs some modification because it merely allows always the same image signal to be written in the pixels A and B. Therefore a pixel selecting portion 113 is provided, whereby an image signal inputted to the source signal line 110 is sent only to one of a switching TFT 101 of the pixel A and a switching TFT 102 of the pixel B. To describe the driving method briefly, one horizontal period is divided into the former half and the latter half so that writing in the pixel A is completed in the former half of the one horizontal period and then writing in the pixel B is completed in the latter half thereof.

This structure can cut the number of stages of the source signal line side driver circuit to half the number of pixels in the horizontal direction (this may not be applied depending on the structure of the driver circuit, i.e, when the driver circuit has dummy stages). Therefore no difficulties will be found in placing the driver circuit when the pixel pitch is reduced in order to obtain high definition.

Hereinafter, the structures of the electronic device of the present invention are described.

According to a first aspect of the present invention, there is provided an electronic device comprising a source signal line side driver circuit, a gate signal line side driver circuit, a pixel selecting signal line side driver circuit and a pixel portion, characterized in that:

the pixel portion has m source signal lines, k gate signal lines and 2km pixels;

each of the m source signal lines has k pixel selecting portions;

each of the m source signal lines is electrically connected through the pixel selecting portions to 2k pixels;

the 2km pixels each have a switching transistor, an EL driving transistor and an EL element;

the switching transistor has a gate electrode electrically connected to any one of the gate signal lines;

the switching transistor has impurity regions, one of which is electrically connected to any one of the source signal lines and the other of which is electrically connected to a gate electrode of the EL driving transistor; and the EL driving transistor has impurity regions, one of which is electrically connected to a current supply line and the other of which is electrically connected to one of electrodes of the EL element.

According to a second aspect of the present invention, there is provided an electronic device comprising a source signal line side driver circuit, a gate signal line side driver circuit, a pixel selecting signal line side driver circuit and a pixel portion, characterized in that:

the pixel portion has m source signal lines, k gate signal lines and 2km pixels;

the 2km pixels each have a switching transistor, an EL driving transistor and an EL element;

the switching transistor has a gate electrode electrically connected to any one of the gate signal lines;

the switching transistor has impurity regions, one of which is electrically connected through a pixel selecting portion to any one of the source signal lines and the other of which is electrically connected to a gate electrode of the EL driving transistor; and the EL driving transistor has impurity regions, one of which is electrically connected to a current supply line and the other of which is electrically connected to one of electrodes of the EL element.

According to a third aspect of the present invention, in the first or second aspect of the present invention, there is provided an electronic device, characterized in that the source signal line side driver circuit performs image signal writing operation twice during one horizontal period on each of the m source signal lines.

According to a fourth aspect of the present invention, in any one of the first to third aspects of the present invention, there is provided an electronic device, characterized in that:

a first pixel and a second pixel are electrically connected to each of the pixel selecting portions;

each pixel selecting portion selects the first pixel in the former half of one horizontal period whereas it selects the second pixel in the latter half of the horizontal period; and an image signal inputted from the source signal lines is written only in the pixel selected by the pixel selecting portion.

According to a fifth aspect of the present invention, in any one of the first to fourth aspects of the present invention, there is provided an electronic device, characterized in that each pixel selecting portion has an n-channel transistor and a p-channel transistor.

According to a sixth aspect of the present invention, in any one of the first to fourth aspects of the present invention, there is provided an electronic device, characterized in that each pixel selecting portion has an analog switch.

According to a seventh aspect of the present invention, there is provided a method of driving an electronic device obtaining n bit gray scale display by controlling the length of time an EL element continues to emit light when one frame period consists of n sub-frame periods $SF_1$, $SF_2$, ... and $SF_n$ and the sub-frame periods each have address (writing) periods $Ta_1$, $Ta_2$, ... and $Ta_n$ and sustain (lights-on) periods $Ts_1$, $TS_2$, ... and $Ts_n$, characterized in that, if there are 2m pixels in the horizontal direction of the electronic device, one horizontal period is divided into two periods so that an image signal is written in the first, third, ..., (2m−3)-th or (2m−1)-th pixel during one of the periods whereas an image signal is written in the second, fourth, ..., (2m−2)-th or 2m-th pixel during the other period.

According to an eighth aspect of the present invention, in the seventh aspect of the present invention, there is provided a method of driving an electronic device, characterized in that the period during which an image signal is written in the first, third, ..., (2m−3)-th or (2m−1)-th pixel corresponds to the former half of one horizontal period and the period during which an image signal is written in the second, fourth, ..., (2m−2)-th or 2m-th pixel corresponds to the latter half of the horizontal period.

According to a ninth aspect of the present invention, in the seventh aspect of the present invention, there is provided a method of driving an electronic device, characterized in that the period during which an image signal is written in the first, third, ..., (2m−3)-th or (2m−1)-th pixel corresponds to the latter half of one horizontal period and the period during which an image signal is written in the second, fourth, ..., (2m−2)-th or 2m-th pixel corresponds to the former half of the horizontal period.

BRIEF DESCRIPTION OF THE DRAWINGS

In the accompanying drawings:

FIGS. 3A to 3D are timing charts according to a time gray scale method;

FIGS. 4A to 4D are timing charts according to a time gray scale method in the electronic device of the present invention;

FIGS. 8A and 8B are timing charts of a method of driving an electronic device in accordance with Embodiment 2 of the present invention;

FIGS. 11A and 11B are timing charts of a driving method according to Embodiment 4, in which a non-display period is provided;

FIGS. 14A to 14C are diagrams showing an exemplary process of manufacturing an electronic device in accordance with Embodiment 5 of the present invention;

FIGS. 15A to 15C are diagrams showing the exemplary process of manufacturing an electronic device in accordance with Embodiment 5 of the present invention;

FIGS. 17A and 17B are diagrams showing an electronic device according to Embodiment 6, in which FIG. 17A is a top view thereof and FIG. 17B is a sectional view thereof;

DETAILED DESCRIPTION OF THE PREFERRED EMBODIMENTS

An embodiment mode of the present invention will be described below.

Figure 1A:
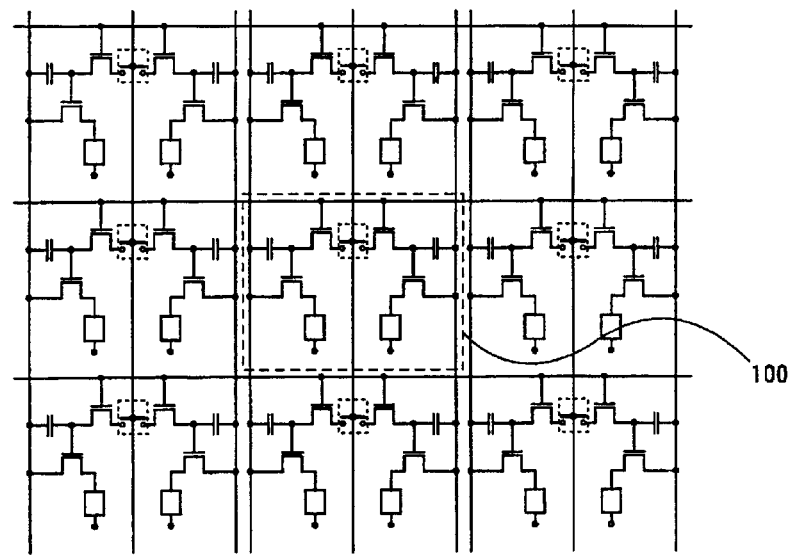
FIGS. 1A and 1B are diagrams showing the structure of pixels in an electronic device of the present invention.
Figure 1B:
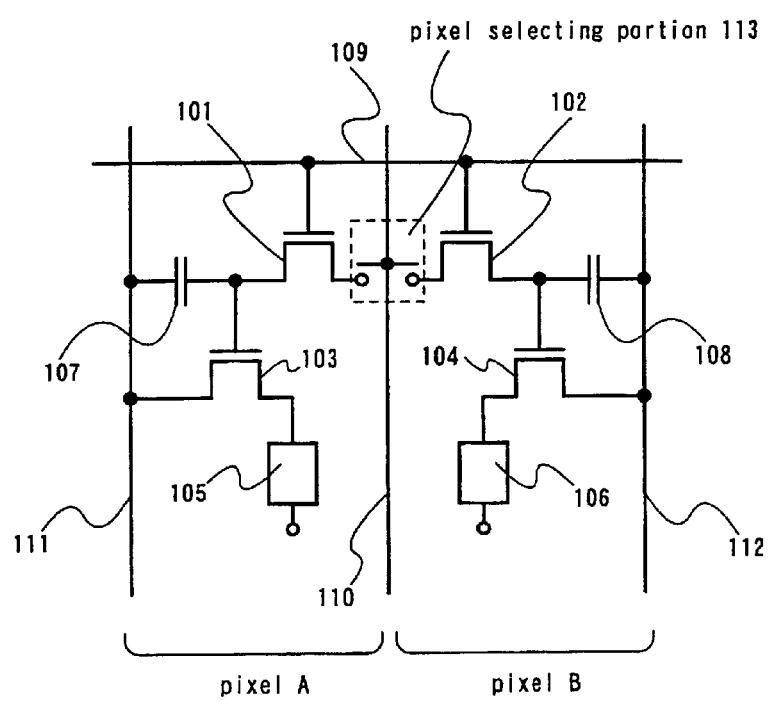

The main structure of the present invention is shown in FIGS. 1A and 1B. A section defined by a dotted line frame in FIG. 1A is enlarged in FIG. 1B.

Pixels of an electronic device according to the present invention are characterized in that two pixels are connected to one source signal line 110. The two pixels are designated as pixel A and pixel B. The pixel A has a first switching TFT 101, a first EL driver TFT 103, a first EL element 105 and a first storage capacitor 107. The pixel B has a second switching TFT 102, a second EL driver TFT 104, a second EL element 106 and a second storage capacitor 108. A pixel selecting portion 113 has a function of outputting an image signal inputted from the source signal line to only one of the first switching TFT 101 of the pixel A and the second switching TFT 102 of the pixel B. As mentioned above, the polarity of the first switching TFT 101 and the second switching TFT 102 may be of either n-channel type or p-channel type. The polarity of the first EL driver TFT 103 and the second EL driver TFT 104 is determined depending on the structure of the EL elements as described above.

When the electronic device has m×k pixels, it has m/2 source signal lines and k gate signal lines. Two adjacent pixels with a source signal line interposed therebetween are electrically connected to the source signal line through the pixel selecting portion. With k gate signal lines provided, the number of pixels connected to each source signal line is 2×(the number of gate signal lines)=2k.

The pixel selecting portion 113 and adjacent pixel selecting portion 113 are arranged side by side in the lateral direction, and all pixel selecting portions operate uniformly. To describe the operation specifically with reference to FIG. 1A, in a gate signal line selecting period, a signal is inputted to the pixel selecting portion 113 in the former half thereof to write the signal only in the pixel A and then a signal is again inputted to the pixel selecting portion in the latter half thereof to write the signal only in the pixel B. Thus the source signal line side driver circuit performs writing operation twice in one horizontal period, that is, writing in the pixel A and writing in the pixel B.

Figure 2A:
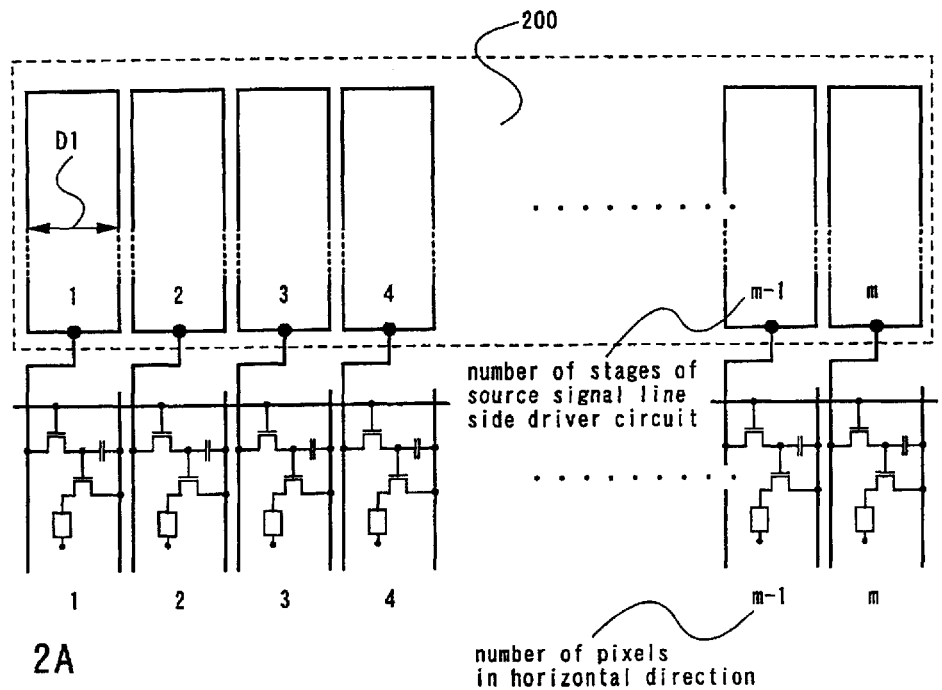
FIGS. 2A and 2B are diagrams showing the difference in number of stages of a driver circuit between a conventional electronic device and the electronic device of the present invention.

FIG. 2A shows a source signal line side driver circuit in an ordinary electronic device and one row of pixels in a pixel portion thereof. A source signal line side driver circuit 200 has a plurality of stages with each stage consisting of a shift register, a first latch circuit and a second latch circuit, for controlling one source signal line. When there are m pixels in the horizontal direction, the number of stages of the source signal line side driver circuit is equal to the number of pixels, and the driver circuit has m stages. In FIG. 2A, the width denoted by D1 is the width for placing one stage of circuits of the source signal line side driver circuit. If the pixels are increased in number without increasing the size of the panel, the pixel pitch is reduced to naturally reduce the width D1, thereby making it difficult to place the driver circuit.

Figure 2B:
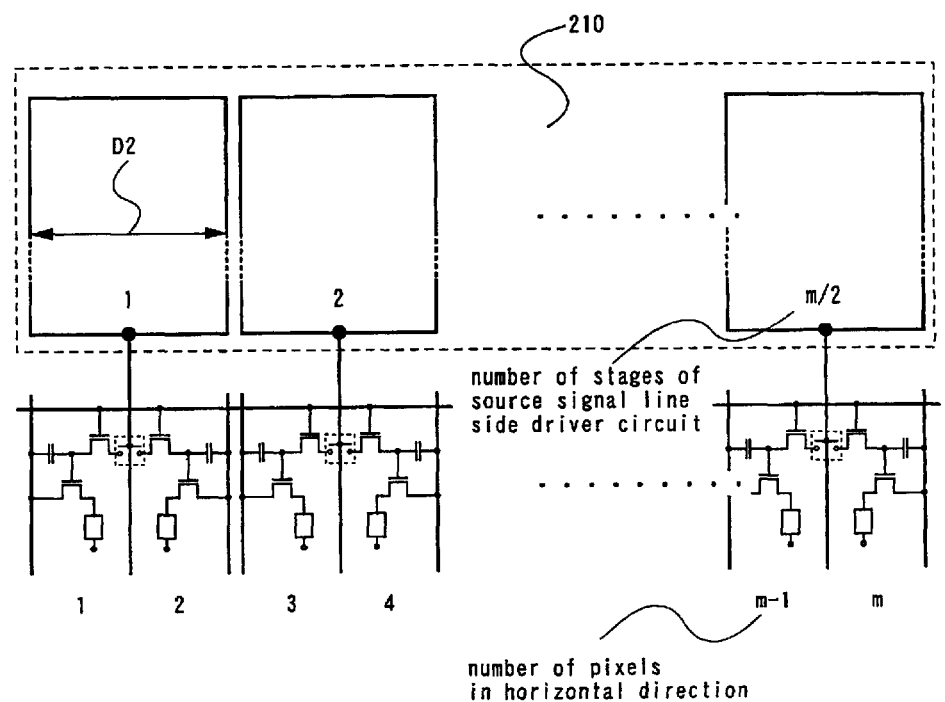

FIG. 2B shows a source signal line side driver circuit in the electronic device of the present invention and one row of pixels in a pixel portion thereof. A source signal line side driver circuit 210 has a plurality of stages with each stage consisting of a shift register, a first latch circuit and a second latch circuit, for controlling one source signal line. When there are n pixels in the horizontal direction, the circuit in FIG. 2B has m/2 source signal lines because the pixels structured in accordance with the present invention share one source signal line between two adjacent pixels. Therefore the number of stages of the source signal line side driver circuit is m/2 stages despite having the same number of pixels as FIG. 2A. In this case, the width denoted by D2 in FIG. 2B is the width for placing one stage of circuits of the source signal line side driver circuit. When the pixel pitch in FIG. 2B is equal to the pixel pitch in FIG. 2A, the width D2 is twice the width D1. The present invention thus has no difficulties in placing the driver circuit if the pixel pitch is reduced in order to enhance the definition.

The actual drive will be described using timing charts. The description will be given taking as an example the case in which a method using digital gray scale and time gray scale in combination to obtain gray scale display is employed as the driving method.

FIGS. 3A to 3D are timing charts in the case where an image is displayed in 4 bit ($2^4$=16) gray scale at a frame frequency of 60 Hz in an electronic device having m (in horizontal direction)×n (in vertical direction) pixels. The description will be given in temporal order. Display corresponding to one screen is carried out 60 times in one second under this setting. A period for preparing display of one screen is one frame period. (FIG. 3A)

One frame period is divided into a plurality of sub-frame periods. The division is for obtaining gray scale display by utilizing the sum of the time periods during which the EL elements emit light. If k bit gray scale display is to be obtained, k sub-frame periods are required. Since 4-bit gray scale is intended in this example, one frame period is divided into four sub-frame periods consisting of $SF_1$, $SF_2$, $SF_3$ and $SF_4$. Each sub-frame period has address (writing) periods and sustain (lights-on) periods. An address (writing) period is a period for writing signals for one screen, and hence all of address (writing) periods $Ta_1$ to $Ta_4$ have the same length. The length of the sustain (lights-on) periods is set so as to satisfy the relation $Ts_1:Ts_2:Ts_3:Ts_4=2^3:2^2:2^1:2^0=8:4:2:1$. The gray scale display is obtained by making the EL elements emit light during some of the sustain (lights-on) periods while preventing the EL elements from emitting light during the rest of the sustain (lights-on) periods. The sub-frame periods may not always come in ascending order but at random. (FIG. 3B)

In an address (writing) period, gate signal lines are selected one by one starting from the line on the first row and digital image signals successively inputted from the source signal lines are written in the pixels. A period during which one gate signal line is selected is defined as one horizontal period. After the period for selecting the last row is ended, a sustain (lights-on) period is started and the EL elements emit light. (FIG. 3C)

In one horizontal period, the source signal line side driver circuit operates to hold digital image signals therein as described above. Receiving pulses from the shift register, the first latch circuit holds digital image signals in a dot data sampling period. When the first latch circuit completes latching for one column in the horizontal direction, a line data latch period is started where the first latch circuit transfers the digital image signals to the second latch circuit. (FIG. 3D)

This is the usual driving method in which digital gray scale and time gray scale are used in combination. Now, a case in which the electronic device of the present invention is driven by a similar method will be described.

Similar to FIGS. 3A to 3D, FIGS. 4A to 4D are timing charts in the case where an image is displayed in 4 bit ($2^4$=16) gray scale at a frame frequency of 60 Hz in an electronic device having m (in horizontal direction)×n (in vertical direction) pixels. The description will be given in temporal order. Display corresponding to one screen is carried out 60 times in one second under this setting. A period for preparing display of one screen is one frame period. (FIG. 4A)

One frame period is divided into a plurality of sub-frame periods. Since 4-bit gray scale is intended here, one frame period is divided into four sub-frame periods consisting of $SF_1$, $SF_2$, $SF_3$ and $SF_4$. Each sub-frame period has address (writing) periods and sustain (lights-on) periods. An address (writing) period is a period for writing signals for one screen, and hence all of address (writing) periods $Ta_1$ to $Ta_4$ have the same length. The length of the sustain (lights-on) periods is set so as to satisfy the relation $Ts_1:Ts_2:Ts_3:Ts_4 = 2^3:2^2:2^1:2^0 = 8:4:2:1$. The gray scale display is obtained by making the EL elements emit light during some of the sustain (lights-on) periods while preventing the EL elements from emitting light during the rest of the sustain (lights-on) periods. The sub-frame periods may not always come in ascending order but at random. (FIG. 4B)

In an address (writing) period, gate signal lines are selected one by one starting from the line on the first row and digital image signals successively inputted from the source signal lines are written in the pixels. A period during which one gate signal line is selected is defined as one horizontal period. After the period for selecting the last row is ended, a sustain (lights-on) period is started and the EL elements emit light. The driving method and timings up through this point are the same as the usual method. (FIG. 4C)

In the electronic device of the present invention, a signal is written in one pixel during the former half of one horizontal period and then a signal is written in the other pixel that is connected to the same source signal line during the latter half of the horizontal period. During the former half of one horizontal period, the pixel selecting portion selects the first, third, fifth, . . . , (m−3)-th or (m−1)-th pixel (corresponding to the pixel A in FIGS. 1A and 1B). The first latch circuit receiving pulses from the shift register holds digital image signals in a dot data sampling period for the pixel A. When latching for one row in the horizontal direction is completed for the pixel A, a line data latch period is started where the data are transferred from the first latch circuit to the second latch circuit. In the latter half of the horizontal period, the pixel selecting portion selects the second, fourth, sixth, . . . , (m−2)-th or m-th pixel (corresponding to the pixel B in FIGS. 1A and 1B). The first latch circuit receiving pulses from the shift register holds digital image signals in a dot data sampling period for the pixel B. When latching for one row in the horizontal direction is completed for the pixel B, a line data latch period is started where the digital image signals are transferred from the first latch circuit to the second latch circuit. (FIG. 4D)

The present invention thus can reduce the number of stages of the source signal line side driver circuit to m/2 stages from m stages of the usual case when there are m pixels in the horizontal direction. In addition, the present invention does not need to raise the operating frequency and hence has no problem regarding the reliability. Therefore, the invention can avoid problems in designing circuit, such as insufficient space for placing the driver circuit which is caused by reducing the pixel pitch in order to enhance the definition of the display screen.

Embodiments of the present invention will be described below.

Embodiment 1

Figure 5:
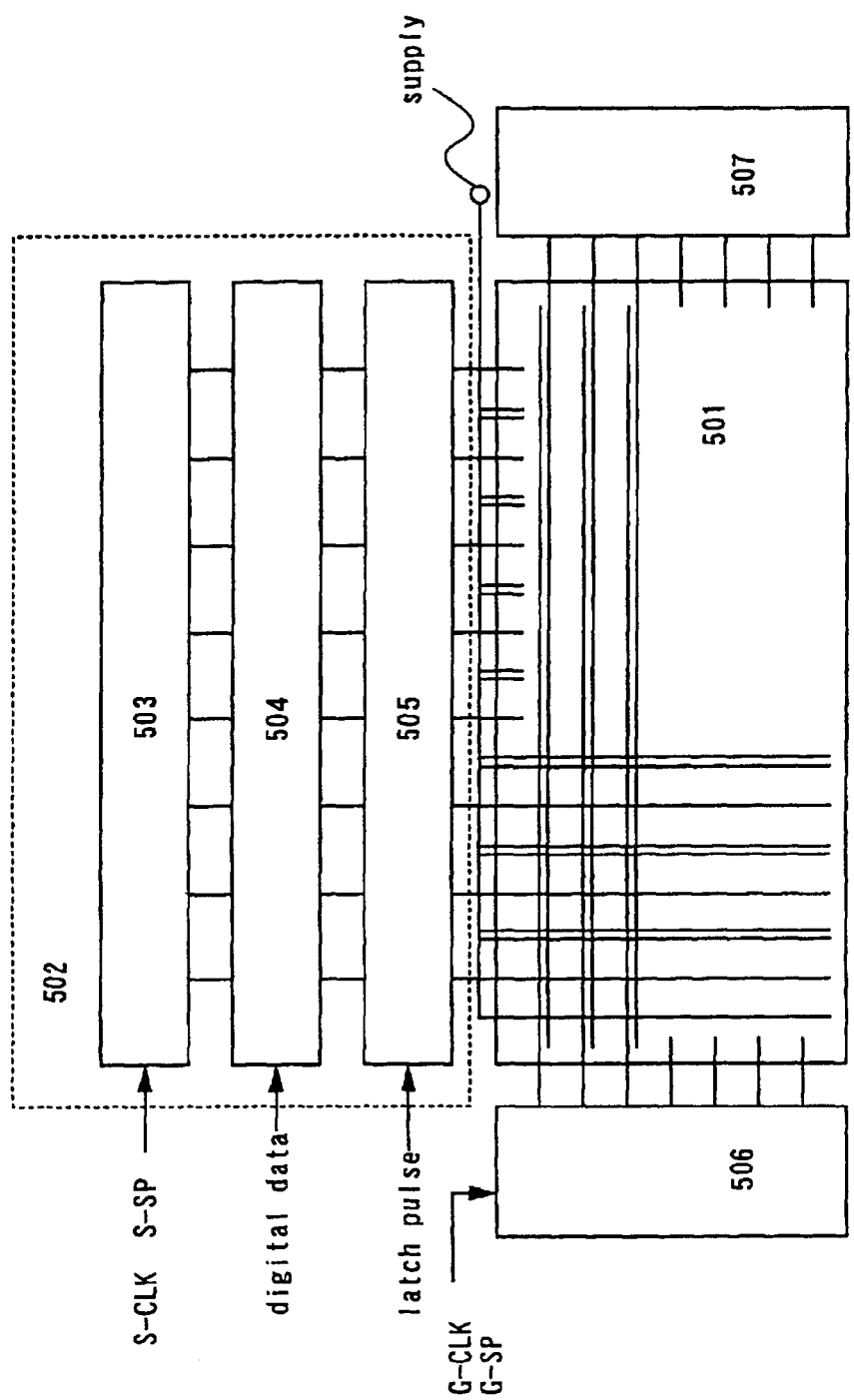
FIG. 5 is a diagram showing an example of the circuit structure of an electronic device in accordance with Embodiment 1 of the present invention.

FIG. 5 shows an example of the circuit structure of an electronic device according to the present invention. A pixel portion 501 is placed at the center. Arranged in the periphery of the pixel portion 501 are: a source signal line side driver circuit 502 for controlling source signal lines; a gate signal line side driver circuit 506 for controlling gate signal lines; and a pixel selecting signal line side driver circuit 507 for controlling pixel selecting portions. A power supply for supplying a current to EL elements is connected to current supply lines of the pixel portion 501.

Figure 6A:
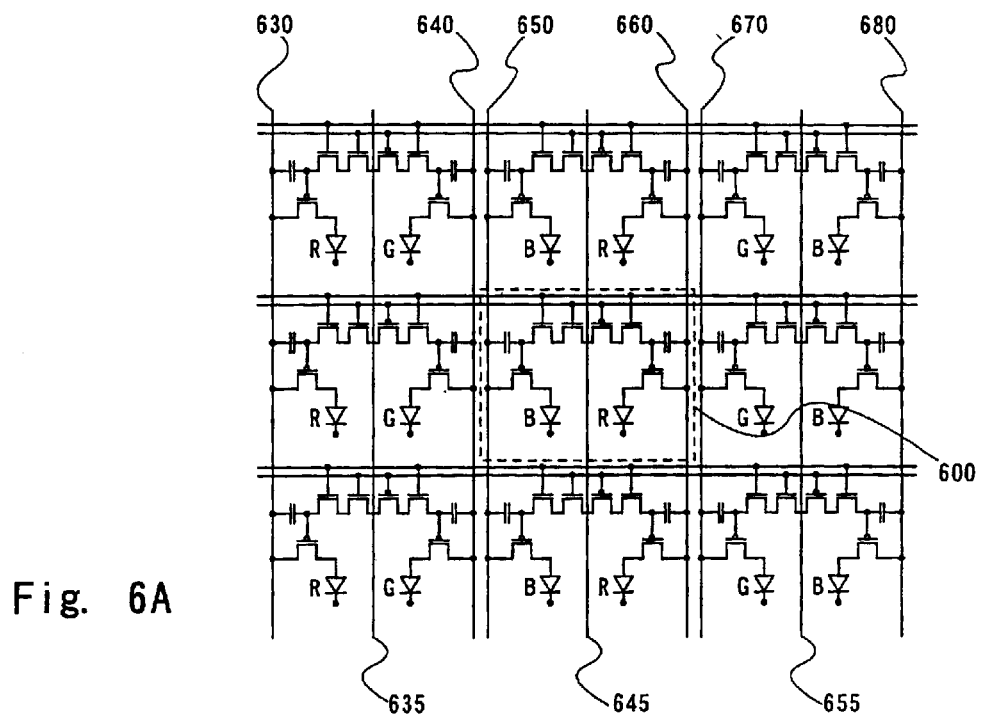
FIGS. 6A and 6B are diagrams showing an example of the circuit structure of a pixel portion in the electronic device in accordance with Embodiment 1 of the present invention.
Figure 6B:
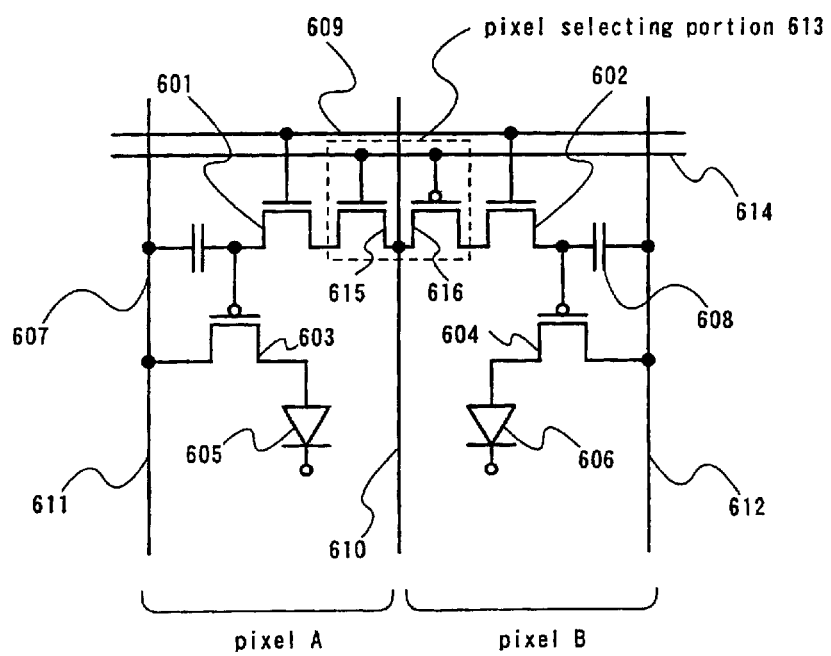

A part of the pixel portion 501 of FIG. 5 is enlarged in FIG. 6A. FIG. 6A shows a matrix consisting of 6×3 pixels. A section indicated by a dotted line frame 600 forms one unit, and includes two pixels. An enlarged view thereof is shown in FIG. 6B.

Two pixels are put by the side of a source signal line 610 with a pixel A placed to the left and a pixel B to the right. The pixel A has a first switching TFT 601, a first EL driver TFT 603, a first EL element 605 and a first storage capacitor 607. The pixel B has a second switching TFT 602, a second EL driver TFT 604, a second EL element 606 and a second storage capacitor 608. In the example shown in Embodiment 1, the switching TFTs 601 and 602 are n-channel TFTs whereas the EL driver TFTs 603 and 604 are p-channel TFTs. A pixel selecting portion 613 in Embodiment 1 is composed of an n-channel TFT 615, a p-channel TFT 616 and a pixel selecting signal line 614. A Hi signal is inputted to the pixel selecting signal line to turn the n-channel TFT 615 conductive, so that a signal from the source signal line 610 is written in the pixel A. If a LO signal is inputted to the pixel selecting signal line, the p-channel TFT 616 is turned conductive so that a signal from the source signal line 610 is written in the pixel B.

Figure 7A:
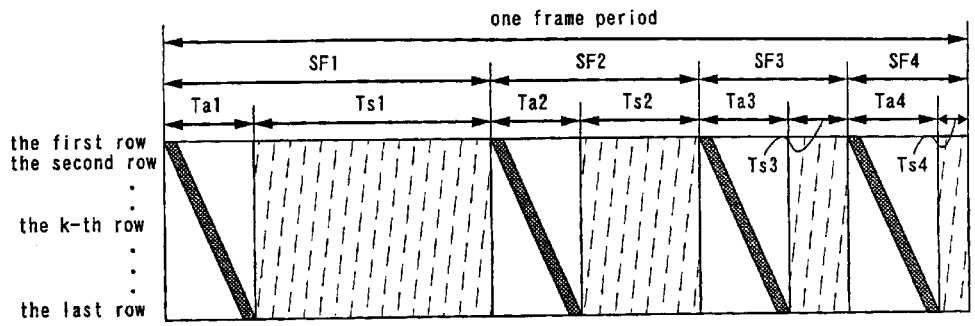
FIGS. 7A and 7B are timing charts of a method of driving the electronic device in accordance with Embodiment 1 of the present invention.
Figure 7B:
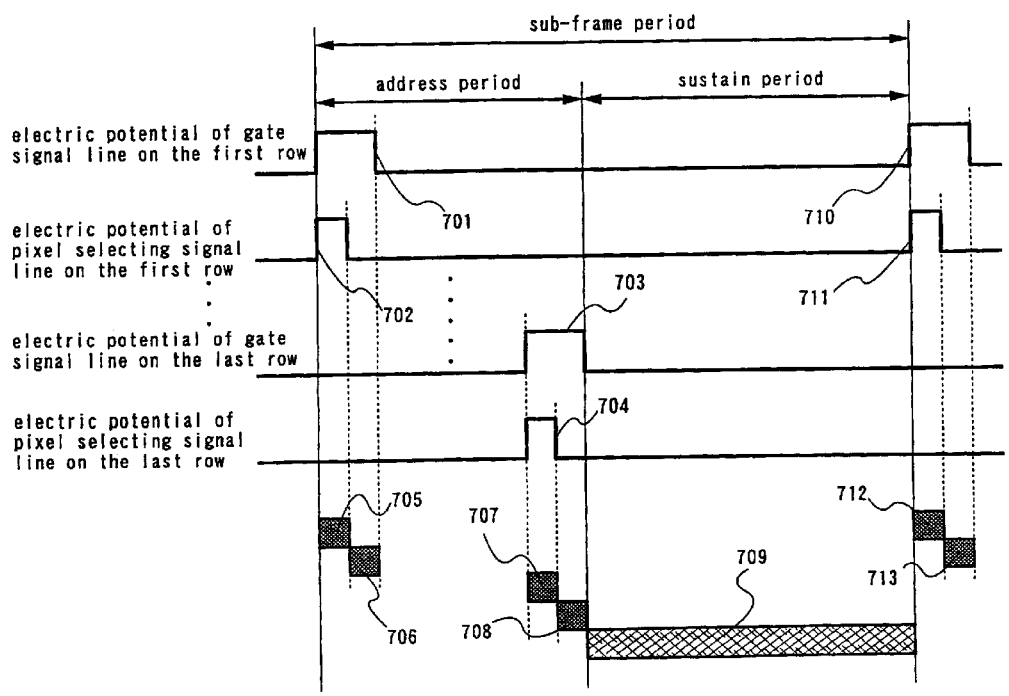

The actual drive will be described with reference to FIGS. 6A and 6B and timing charts of FIGS. 7A and 7B. In FIG. 7A, one frame period is divided into four sub-frame periods to obtain 4 bit gray scale display. FIG. 7B shows the electric potential of a gate signal line 609 and of the pixel selecting signal line 614 in one of the sub-frame periods of FIG. 7A.

First, the gate signal line on the first row is selected (701). In the former half of this one horizontal period, a Hi signal is inputted to the pixel selecting signal line 614 (702) to turn the n-channel TFT 615 conductive. Thus a signal is written only in the pixel A during this half period (705). Then a LO signal is inputted to the pixel selecting signal line 614 in the latter half of the horizontal period, whereby the n-channel TFT 615 that has been conductive is turned unconductive and instead, the p-channel TFT 616 is turned conductive. Thus a signal is written only in the pixel B during this half period (706).

The rest of the gate signal lines are selected one by one and now the gate signal line on the last row is selected (703). The completion of writing a signal for the last row is accompanied with completion of the address (writing) period of the current sub-frame period and start of a sustain (lights-on) period where the EL elements 605 and 606 begin to emit light. The sustain (lights-on) period continues until the next address (writing) period is started and the gate signal line on the first row is selected again (710). The operation above is repeated in all of the sub-frame periods to thereby display an image.

The structure shown in FIG. 6A can readily be applied to a color electronic device having pixels for three colors of R, G and B. Each pixel has an EL element that emits one of the three colors of light and which color of light the element of concern emits can be known by looking at the symbol R, G or B affixed to the EL elements to their left in FIG. 6A. The voltage-luminance characteristic of the EL element varies depending upon which color of light out of R, G and B the element emits. Therefore, in order to obtain the uniform luminance, different levels of electric potential has to be given to current supply lines 630, 640, 650, 660, 670 and 680. Specifically, the current supply lines 630 and 660 have to have the electric potential in accordance with R, the current supply lines 640 and 670 have to have the electric potential in accordance with G, and the current supply lines 650 and 680 have to have the electric potential in accordance with B. Signals of R and G are inputted to a source signal line 635, signals of B and R are inputted to a source signal line 645, and signals of G and B are inputted to a source signal line 655.

The n-channel TFT and the p-channel TFT are used to select between the pixel A and the pixel B in Embodiment 1. However, if the space permits, an analog switch or the like may be used for the selecting operation. Alternatively, two gate signal lines may be arranged in parallel so that the switching TFT of the pixel A is turned conductive when the first gate signal line thereof is selected whereas the switching TFT of the pixel B is turned conductive when the second gate signal line thereof is selected.

Embodiment 2

According to a usual time gray scale method, a sustain (lights-on) period in each sub-frame period is started after writing for one screen is completed as shown in FIG. 8A. In other words, an address (writing) period and a sustain (lights-on) period are completely separated from each other.

A merit of this method is that the length of sustain (lights-on) periods can be set irrespective of the length of each address (writing) period. In the time gray scale method, the length of the sustain (lights-on) periods is set so as to satisfy the relation $Ts1:Ts2: \ldots :Tsn=2^{(n-1)}:2^{(n-2)}: \ldots :1$ and gray scale display is obtained by controlling the length of the lights-on period. This means that the minimum unit sustain (lights-on) period has to be shortened in order to obtain multi-gray scale while setting the one frame period to a fixed length. In this case also, the method can readily set the length of the sustain (lights-on) periods.

On the other hand, the method has a demerit of low duty ratio (ratio of the total length of all the sustain (lights-on) periods to the length of one frame period) because no pixel on the screen is lit during the address (writing) periods. Although the length of the sustain (lights-on) periods can be set without restriction as described above, the low duty ratio is further lowered when the number of address (writing) periods is increased in order to obtain multi-gray scale. There is no other way to solve this problem than raising the operating frequency of the driver circuit to shorten the length of the address (writing) period itself. In fact, the level of multi-gray scale that can be reached in this way is limited. Moreover, the method has another demerit in that there are many idle periods in one frame period because neither writing or light emission takes place for the rest of the rows (the range denoted by 801) while the gate signal line on one row is selected.

Then a driving method is proposed in which address (writing) periods and sustain (lights-on) periods partially overlap with each other as shown in FIG. 8B. According to this method, for instance, the gate signal line on the k-th row is selected and a signal is written in the pixels. When the writing is completed, the EL elements on the k-th row immediately enter the sustain (lights-on) period. The sustain (lights-on) period lasts until the next time the gate signal line on the k-th row is selected. In short, the EL elements on all rows but the k-th row are in the sustain (lights-on) period while the gate signal line on the k-th row is selected. A high duty ratio thus can be obtained and hence the method is also effective in obtaining multi-gray scale.

However, an image signal can not be written normally if the address (writing) periods of different sub-frame periods overlap with each other because it means that plural different gate signal lines are selected simultaneously. Accordingly, in the method as the one illustrated in FIG. 8B, the minimum unit for the length of the sustain (lights-on) periods has to be longer than the period starting upon completion of the selecting of the gate signal line on the first row and ending with completion of the selecting of the gate signal line on the last row (802).

Figure 9A:
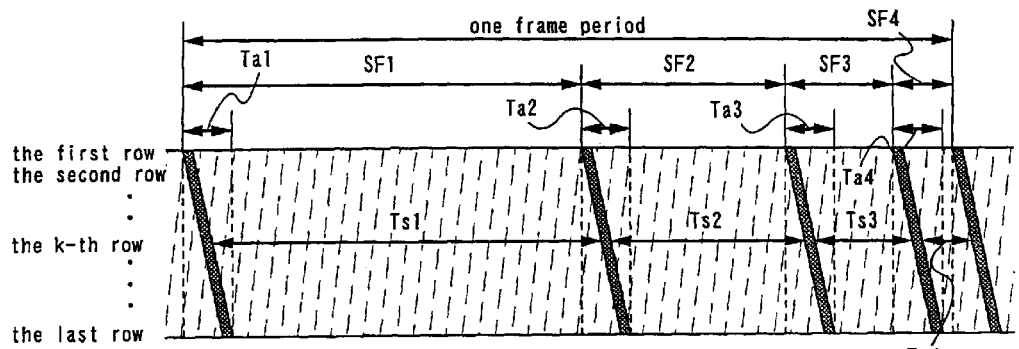
FIGS. 9A and 9B are timing charts of the method of driving the electronic device in accordance with Embodiment 2 of the present invention.
Figure 9B:
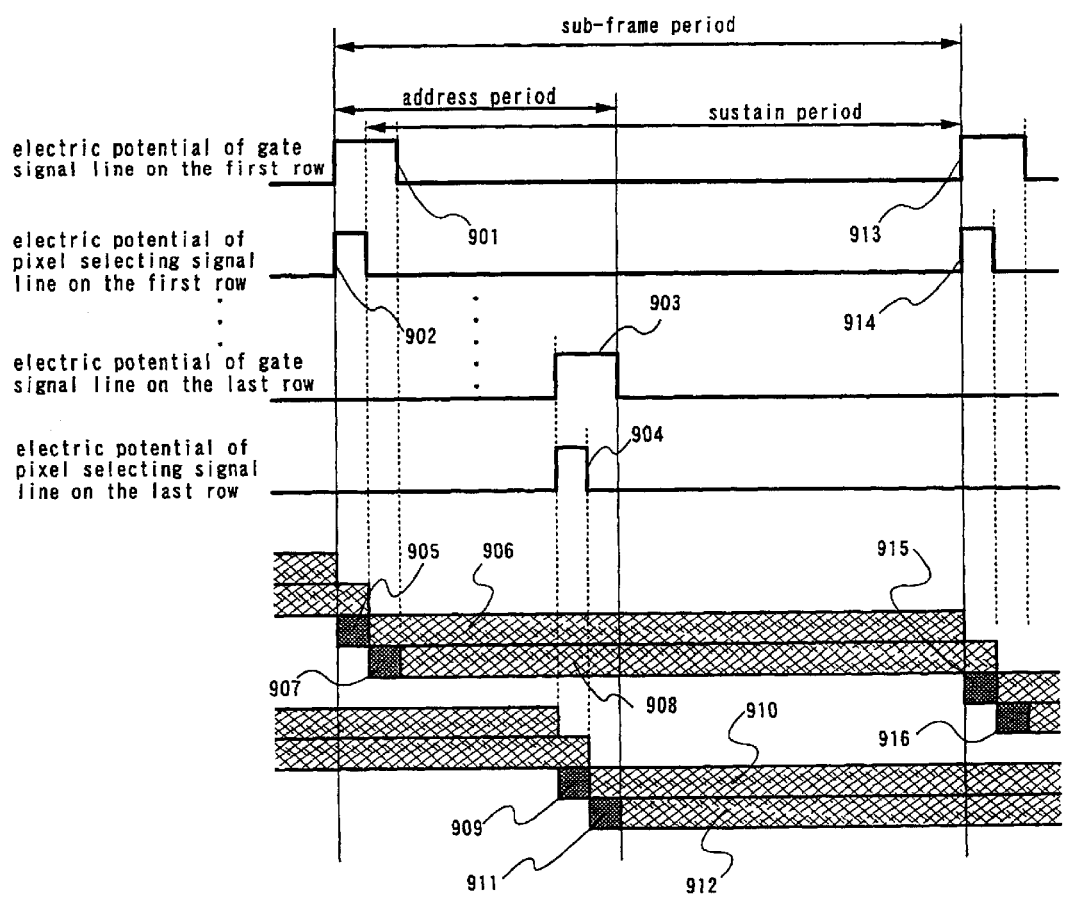

The actual drive in accordance with the method illustrated in FIG. 8B will be described with reference to FIGS. 6A and 6B and timing charts of FIGS. 9A and 9B. In FIG. 9A, one frame period is divided into four sub-frame periods to obtain 4 bit gray scale display. FIG. 9B shows the electric potential of the gate signal line 609 and of the pixel selecting signal line 614 in one of the sub-frame periods of FIG. 9A.

First, the gate signal line on the first row is selected (901). In the former half of this one horizontal period, a Hi signal is inputted to the pixel selecting signal line 614 (902) to turn the n-channel TFT 615 conductive. Thus a signal is written only in the pixel A during this half period (905). Then a LO signal is inputted to the pixel selecting signal line 614 in the latter half of the horizontal period, whereby the n-channel TFT 615 that has been conductive is turned unconductive and instead, the p-channel TFT 616 is turned conductive. Thus a signal is written only in the pixel B during this half period (907). Here, the pixel A has already entered a sustain (lights-on) period while a signal is written in the pixel B (906). The pixel B also enters a sustain (lights-on) period immediately after writing of the signal is completed (908).

The above operation is repeated every time the gate signal line on the respective rows is selected. The address (writing) period is ended as writing in the pixel A for the last row is completed in the former half of one horizontal period and writing in the pixel B for the last row is completed in the latter half of the horizontal period (909, 911). For instance, the sustain (lights-on) period for the pixel A on the k-th row ends immediately before the gate signal line on the k-th row is again selected in the next address (writing) period and writing of a signal in the pixel A is started in the former half thereof (915). The operation above is repeated in all of the sub-frame periods, to thereby display an image.

As the description up to this point clarifies, all the pixels controlled by the gate signal lines that are not on the k-th row enter the sustain (lights-on) period while the gate signal line on the k-th row is selected. In this state, when a signal is written in the pixel A on the k-th row in the former half of one horizontal period, the pixel B is still in the sustain (lights-on) period, and the pixel A is already in the sustain (lights-on) period when a signal is written in the pixel B in the latter half of the horizontal period. Therefore the duty ratio can be enhanced greatly as compared with the timing shown in Embodiment 1.

The structure shown in FIG. 6A can readily be applied to a color electronic device having pixels for three colors of R, G and B. Each pixel has an EL element that emits one of the three colors of light and which color of light the element of concern emits can be known by looking at the symbol R, G or B affixed to the EL elements to their left in FIG. 6A. The voltage-luminance characteristic of the EL element varies depending upon which color of light out of R, G and B the element emits. Therefore, in order to obtain the uniform luminance, different levels of electric potential has to be given to the current supply lines 630, 640, 650, 660, 670 and 680. Specifically, the current supply lines 630 and 660 have to have the electric potential in accordance with R, the current supply lines 640 and 670 have to have the electric potential in accordance with G, and the current supply lines 650 and 680 have to have the electric potential in accordance with B. Signals of R and G are inputted to the source signal line 635, signals of B and R are inputted to the source signal line 645, and signals of G and B are inputted to the source signal line 655.

Embodiment 3

Figure 10A:
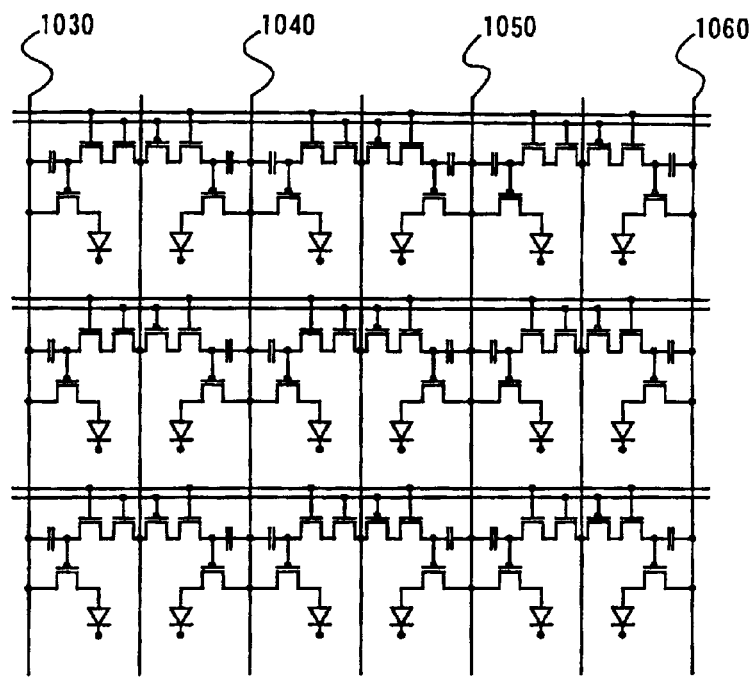
FIGS. 10A and 10B are diagrams showing an example of the circuit structure of a pixel portion in an electronic device in accordance with Embodiment 3 of the present invention.
Figure 10B:
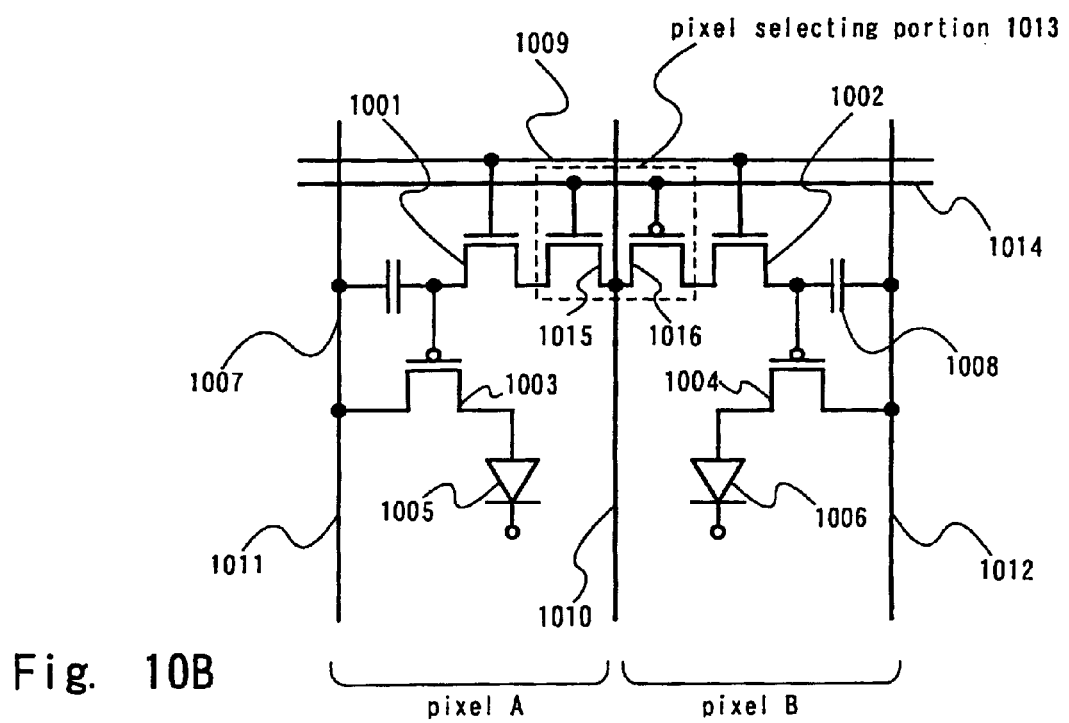

An electronic device for monochrome gray scale display does not require to consider the difference in voltage-luminance characteristic between EL elements of different colors unlike an electronic device for color display. Therefore, in the monochrome device, current supply lines 1030, 1040, 1050 and 1060 are each shared between adjacent pixels without any difficulty as shown in FIGS. 10A and 10B. The major problem the present invention is set to solve is reduced pixel pitch accompanied with enhancement of the definition. The reduced pixel pitch naturally leads to reduction in aperture ratio. Therefore, Embodiment 3 in which current supply lines are shared to reduce the number of wirings is simple yet very effective against reduction in aperture ratio.

Embodiment 4

Embodiment 2 has explained limitations put on the minimum unit length of a sustain (lights-on) period in the case where address (writing) periods and sustain (lights-on) periods are not completely separated from each other and the reason why. Embodiment 4 gives descriptions on the solution thereof and the actual driving.

FIG. 11A is a timing chart for 4-bit gray scale display similar to FIG. 8B. In FIG. 11A, the length of $Ts_4$ is shorter than the minimum unit length mentioned above and hence the address (writing) period $Ta_4$ overlaps with the address (writing) period $Ta_1'$ of SF1 of the next frame period during a period denoted by 1101. During the period 1101, plural different gate signal lines are simultaneously selected and the same signal is written in the pixels associated therewith, making it impossible to display an image normally.

Then, as shown in FIG. 11B, a non-display period 1102 is squeezed in between the end of the sustain (lights-on) period and the start of the period where otherwise the address (writing) periods would overlap with each other. The EL elements do not emit light during the non-display period 1102 whatever signal is written in the pixels. The overlap of plural address (writing) periods thus can be avoided.

Figure 22A:
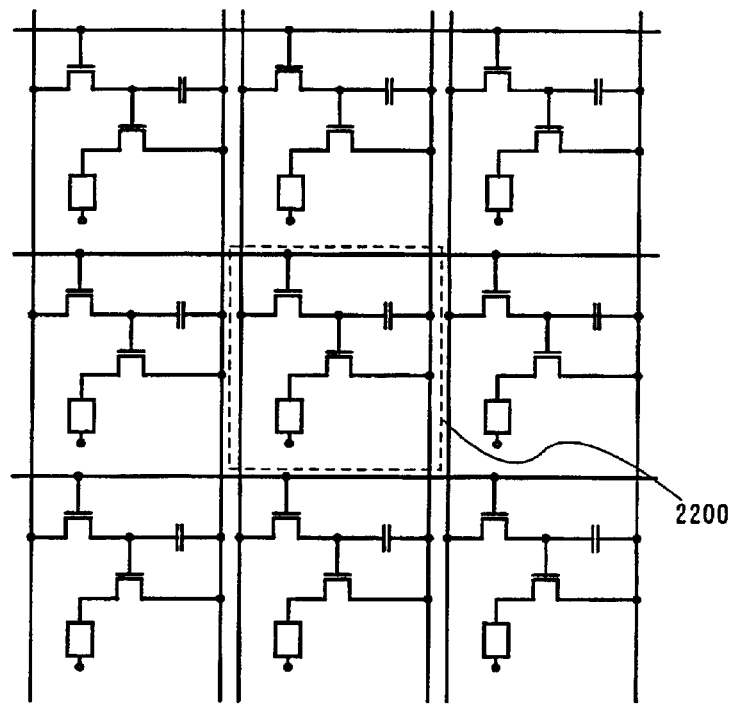
FIGS. 22A and 22B are diagrams showing the structure of a pixel portion in an ordinary electronic device.
Figure 22B:
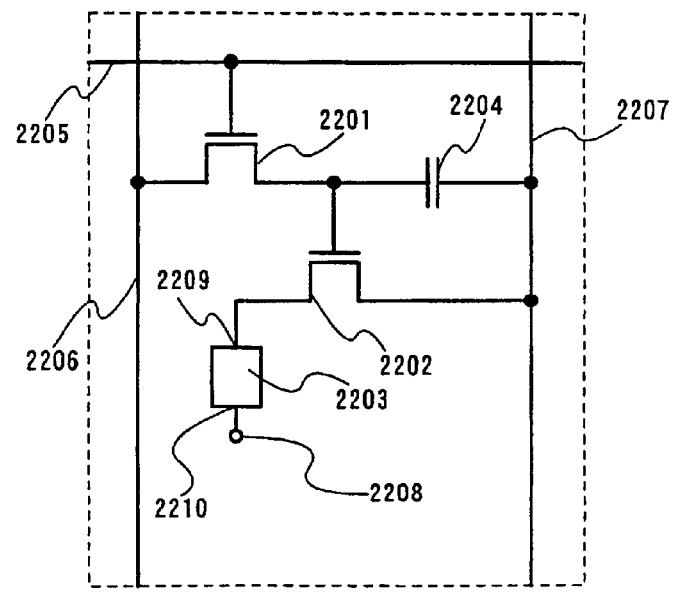

How to provide the non-display period shown in FIG. 11B will be described next. If the non-display period is provided in accordance with the method described here, no special circuit is necessary. Therefore, this solution can be applied to both of the case where the pixels of the present invention as shown in FIGS. 6A and 6B and FIGS. 10A and 10B are used and the case where the ordinary pixels as shown in FIGS. 22A and 22B are used. The method will be described with reference to FIGS. 12A and 12B.

Figure 12A:
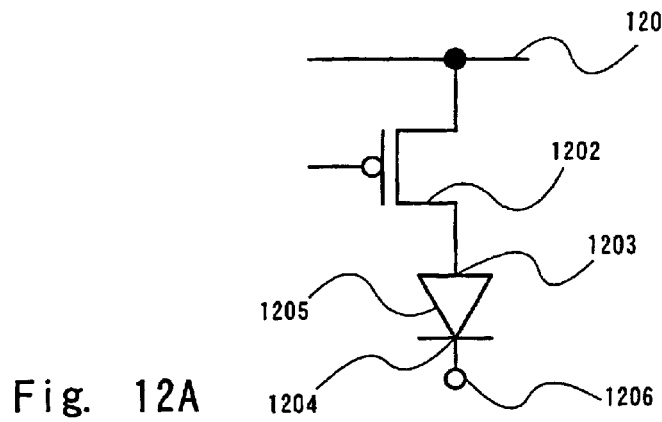
FIGS. 12A and 12B are diagrams illustrating a relation between the source/drain voltage of an EL driving transistor and light emission of an EL element.
Figure 12B:
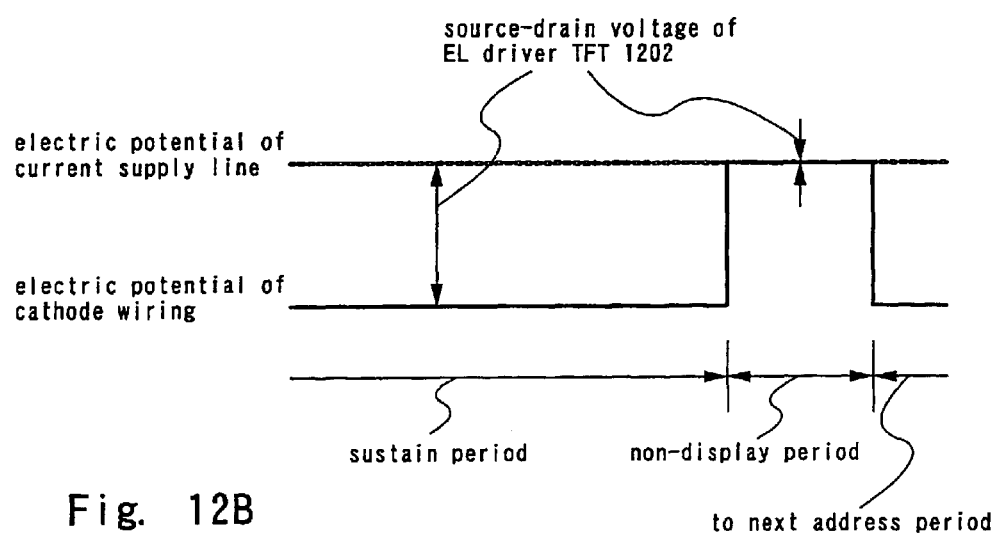

FIG. 12A is a circuit diagram showing the periphery of an EL driver TFT. An EL element 1205 emits light when a current flows through the EL element 1205. The current is caused to flow when there is difference in electric potential between a source region of an EL driver TFT 1202 and a drain region thereof (hereinafter the difference in electric potential between them is referred to as source-drain voltage), i.e., when there is difference in electric potential between a current supply line 1201 and a cathode wiring 1206. Therefore, the electric potential of the cathode wiring 1206 is lower than the electric potential of the current supply line 1201 during a normal sustain (lights-on) period. In a non-display period, the electric potential of the cathode wiring 1206 is raised to the same level as the electric potential of the current supply line 1201. This operation sets the source-drain voltage of the EL driver TFT 1202 to 0, whereby the current flow to the EL element 1205 is cut and the element stops emitting light. (FIG. 12B) During the non-display period, the EL element 1205 is forced to stop emitting light irrespective of a signal written in the pixel.

Figure 13:
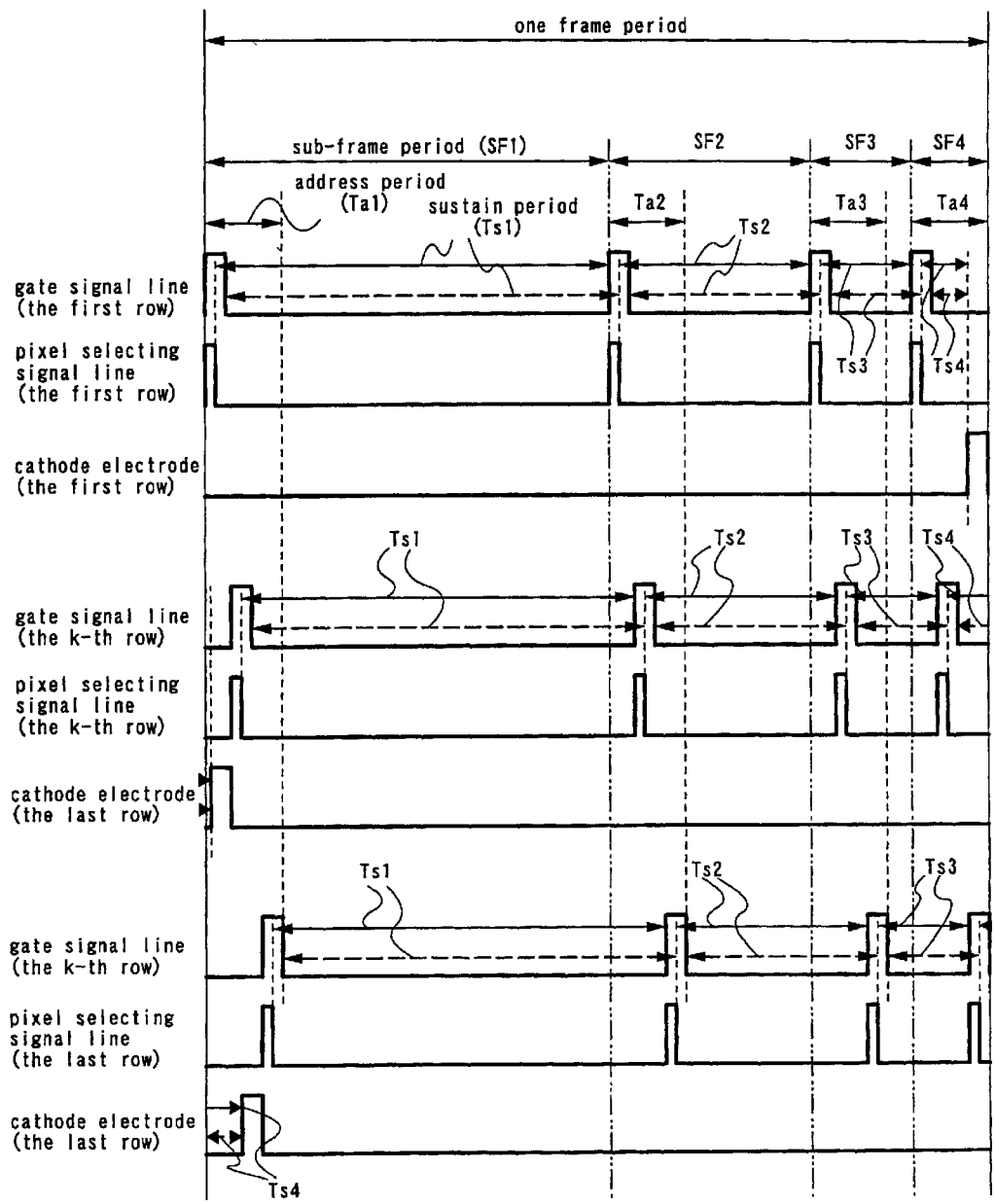
FIG. 13 is a timing chart of the driving method according to Embodiment 4, in which a non-display period is provided.

FIG. 13 shows the electric potential of the gate signal line, the pixel selecting signal line and the cathode wiring in the case where 4 bit gray scale display is obtained in accordance with the timing illustrated in FIG. 11B. The sustain (lights-on) period $Ts_4$ of SF4 that is the sub-frame period for the least significant bit is shorter than $Ta_4$. Therefore, a non-display period (hereinafter referred to as clear period) is provided to avoid the overlap of the address (writing) periods. In FIG. 13, the sustain (lights-on) periods indicated by the solid lines are for the pixel A in which a signal is written during the former half of one horizontal period whereas the sustain (lights-on) periods indicated by the broken lines are for the pixel B in which a signal is written during the latter half of the horizontal period.

The electronic device can be driven normally by the aforementioned method during $SF_1$ to $SF_3$, and that part of explanation is omitted here. In $SF_4$, a signal is written in the pixel A in the former half of one horizontal period and then the sustain (lights-on) period $Ts_4$ is immediately started. Thereafter, a signal is written in the pixel B during the latter half of the horizontal period and then the sustain (lights-on) period $Ts_4$ is immediately started. Upon completion of $Ts_4$, a clear period $Tc_4$ is provided in which the electric potential of the cathode wiring is raised to the same level as the electric potential of the current supply line. The source-drain voltage of the EL driver TFT is thus set to 0 so that the EL element stops emitting light. Then the clear period lasts until the address (writing) period in $SF_4$ is completed.

The driving method described above makes it possible to display an image normally even in the case where the sustain (lights-on) period is so short that address (writing) periods overlap with each other if a usual driving method is used as above. Higher level of multi-gray scale can thus be obtained.

According to the timing illustrated in FIG. 13, the start of the clear period $Tc_4$ for the pixel A coincides with the start of the clear period $Tc_4$ for the pixel B, making the sustain (lights-on) period for the pixel B slightly shorter. This can easily be avoided by providing two lines of cathode wiring and setting the starting points for raising the electric potential of the cathode wirings for the pixel A and the pixel B such that the two does not coincide with each other.

The source-drain voltage of the EL driver TFT may be set to 0 alternatively by setting the electric potential of the cathode wiring 1206 to a fixed value while changing the electric potential of the current supply line 1201. To elaborate, the electric potential of the current supply line 1201 is set higher (or lower) than the electric potential of the cathode wiring 1206 in normal sustain (lights-on) periods and a current flows through the EL element. The electric potential of the current supply line 1201 is lowered (or raised) in a non-display period so that it has the same electric potential as the cathode wiring. The current to the EL element is thus cut and the element stops emitting light as in the method described above.

Embodiment 5

Note that a description is set forth regarding a step for fabricating TFTs for driver circuit (a source signal line driver circuit, a gate signal line driver circuit, a pixel selective signal line driver circuit, or the like) provided in the pixel portion and periphery portion of the pixel portion. For the simplicity of the explanation, a CMOS circuit is shown in figures, which is a fundamental structure circuit for the driver circuit portion.

First, as shown in FIG. 14A, a base film 5002 made of an insulating film such as a silicon oxide film, a silicon nitride film, or a silicon oxynitride film, is formed on a substrate 5001 made of a glass such as barium borosilicate glass or aluminum borosilicate glass, typically a glass such as Corning Corp. #7059 glass or #1737 glass. For example, a lamination film of a silicon oxynitride film 5002a, manufactured from $SiH_4$, $NH_3$, and $N_2O$ by plasma CVD, and formed having a thickness of 10 to 200 nm (preferably between 50 and 100 nm), and a hydrogenated silicon oxynitride film 5002b, similarly manufactured from $SiH_4$ and $N_2O$, and formed having a thickness of 50 to 200 nm (preferably between 100 and 150 nm), is formed. A two layer structure is shown for the base film 5002 in Embodiment 5, but a single layer film of the insulating film, and a structure in which more than two layers are laminated, may also be formed.

Island shape semiconductor layers 5003 to 5006 are formed by crystalline semiconductor films made from a semiconductor film having an amorphous structure, using a laser crystallization method or a known thermal crystallization method. The thickness of the island shape semiconductor layers 5003 to 5006 may be formed from 25 to 80 nm (preferably between 30 and 60 nm). There are no limitations placed on the materials for forming a crystalline semiconductor film, but it is preferable to form the crystalline semiconductor films by silicon or a silicon germanium (SiGe) alloy.

A laser such as a pulse oscillation type or continuous light emission type excimer laser, a YAG laser, or a $YVO_4$ laser can be used to fabricate the crystalline semiconductor films by the laser crystallization method. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse oscillation frequency is set to 30 Hz, and the laser energy density is set form 100 to 400 mJ/cm² (typically between 200 and 300 mJ/cm²). Further, when using the YAG laser, the second harmonic is used and the pulse oscillation frequency is set from 1 to 10 kHz, and the laser energy density may be set from 300 to 600 mJ/cm² (typically between 350 and 500 mJ/cm²). The laser light condensed into a linear shape with a width of 100 to 1000 μm, for example 400 μm, is then irradiated over the entire surface of the substrate. This is performed with an overlap ratio of 80 to 98% for the linear laser light.

A gate insulating film 5007 is formed covering the island shape semiconductor layers 5003 to 5006. The gate insulating film 5007 is formed of an insulating film containing silicon with a thickness of 40 to 150 nm by plasma CVD or sputtering. A 120 nm thick silicon oxynitride film is formed in Embodiment 5. The gate insulating film is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed of a Ta film with a thickness of 50 to 100 nm, and the second conductive film 5009 is formed of a W film having a thickness of 100 to 300 nm, in Embodiment 5.

The Ta film is formed by sputtering, and sputtering of a Ta target is performed by Ar. If appropriate amounts of Xe and Kr are added to Ar, the internal stress of the Ta film is relaxed, and film peeling can be prevented. The resistivity of an α phase Ta film is about 20 μΩcm, and it can be used in the gate electrode, but the resistivity of a β phase Ta film is about 180 μΩcm and it is unsuitable for the gate electrode. The α phase Ta film can easily be obtained if a tantalum nitride film, which possesses a crystal structure similar to that of α phase Ta, is formed with a thickness of about 10 to 50 nm as a base for a Ta film in order to form the phase Ta film.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystal grains of the W film, but for cases in which there are many impurity elements such as oxygen within the W film, crystallization is inhibited, thereby the film becomes high resistance. A W target having a purity of 99.9999% is thus used in sputtering. In addition, by forming the W film while taking sufficient care that no impurities from the gas phase are introduced at the time of film formation, the resistivity of 9 to 20 μΩcm can be achieved.

Note that, although the first conductive film 5008 is a Ta film and the second conductive film 5009 is a W film in Embodiment 5, both may also be formed from an element selected from the group consisting of Ta, W, Ti, Mo, Al, and Cu, or from an alloy material having one of these elements as its main constituent, and a chemical compound material. Further, a semiconductor film, typically a polycrystalline silicon film into which an impurity element such as phosphorus is doped, may also be used. Examples of preferable combinations other than that used in Embodiment 5 include: forming the first conductive film 5008 by tantalum nitride (TaN) and combining it with the second conductive film 5009 formed from a W film; forming the first conductive film 5008 by tantalum nitride (TaN) and combining it with the second conductive film 5009 formed from an Al film; and forming the first conductive film 5008 by tantalum nitride (TaN) and combining it with the second conductive film 5009 formed from a Cu film.

Then, mask 5010 are formed from resist, and a first etching treatment is performed in order to form electrodes and wirings. An ICP (inductively coupled plasma) etching method is used in Embodiment 5. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. In case of mixing $CF_4$ and $Cl_2$, the W film and the Ta film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) are thus formed of the first conductive layers and the second conductive layers in accordance with the first etching process. Reference numeral 5007 denotes a gate insulating film, and the regions not covered by the first shape conductive layers 5011 to 5016 are made thinner by etching of about 20 to 50 nm.

A first doping process is then performed, and an impurity element which imparts n-type conductivity is added. Ion doping or ion injection may be performed for the method of doping. Ion doping is performed under the conditions of a dose amount of from $1 \times 10^{13}$ to $5 \times 10^{14}$ atoms/cm$^2$ and an acceleration voltage of 60 to 100 keV. A periodic table group 15 element, typically phosphorus (P) or arsenic (As) is used as the impurity element which imparts n-type conductivity, and phosphorus (P) is used here. The conductive layers 5011 to 5015 become masks with respect to the n-type conductivity imparting impurity element in this case, and first impurity regions 5017 to 5025 are formed in a self-aligning manner. The impurity element which imparts n-type conductivity is added to the first impurity regions 5017 to 5025 with a concentration in the range of $1 \times 10^{20}$ to $1 \times 10^{21}$ atoms/cm$^3$.

A second etching process is performed next without removing a resist mask, as shown in FIG. 14C. The W film is etched selectively using a mixture of $CF_4$, $Cl_2$, and $O_2$ as a etching gas. The second shape conductive layers 5026 to 5031 (first conductive layers 5026a to 5031a and second conductive layers 5026b to 5031b) are formed by second etching process. Reference numeral 5007 denotes a gate insulating film, and regions not covered by the second shape conductive layers 5026 to 5031 are additionally etched on the order of 20 to 50 nm, forming thinner regions.

The etching reaction of a W film or a Ta film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. Therefore, it becomes possible to have a difference in etching speeds between the W film and the Ta film, and it becomes possible to make the etching speed of the W film larger than that of the Ta film.

A second doping process is then performed, as shown in FIG. 15A. The dose amount is smaller than that of the first doping process in this case, and an impurity element which imparts n-type conductivity is doped under high acceleration voltage conditions. For example, doping performed with the acceleration voltage set from 70 to 120 keV, and a dose amount of $1 \times 10^{13}$ atoms/cm$^3$, and a new impurity region is formed inside the first impurity region is formed inside the first impurity region formed in the island shape semiconductor layers of FIG. 14B. The second conductive layers 5026 to 5030 are used as masks with respect to the impurity element, and doping is performed so as to also add the impurity element into regions under the first conductive layers 5026a to 5030a. A concentration of phosphorus (P) added to third impurity regions 5032 to 5036 is provided with a gradual concentration gradient in accordance with a film thickness of the taper portion of the first conductive layers 5026a to 5030a. Further, in the semiconductor layer overlapping the taper portion of the first conductive layers 5026a to 5030a, from an end portion of the taper portion of the second conductive layer toward an inner side, the impurity concentration is more or less reduced, however, the concentration stays to be substantially the same degree.

A third etching process is carried out as shown in FIG. 15B. The third etching is carried out by using $CHF_6$ for an etching gas and using a reactive ion etching process (RIE process). The third etching process is carried out for partially etching a taper portion of the first conductive layers 5026a to 5031a and reducing a region overlapping the semiconductor layer. By the third etching, there are formed third conductive layers 5037 through 5042 (first conductive layers 5037a to 5042a and second conductive layers 5037b to 5042b). Reference numeral 5007 denotes a gate insulating film, and regions not covered by the third shape conductive layers 5037 to 5042 are additionally etched on the order of 20 to 50 nm, forming thinner regions.

By the third etching, there are formed third impurity regions 5032a to 5036a overlapping the first conductive layers 5037a to 5041a in third impurity regions 5032 to 5036. Second impurity regions 5032b to 5036b between first impurity region and third impurity region.

Fourth impurity regions 5043 to 5054 added with an impurity element having a conductivity type which is the opposite of the first conductivity type impurity element, are then formed as shown in FIG. 15C in the island shape semiconductor layers 5004, 5006 which form p-channel TFTs. The third shaped conductive layers 5038b to 5041b is used as a mask with respect to the impurity element, and the impurity regions are formed in a self-aligning manner. The island shape semiconductor layers 5003, 5005 and wiring portion 5042 which form n-channel TFTs, are covered over their entire surface areas by resist mask 5200. Phosphorus is added to the impurity regions 5043 to 5054 at a different concentration, and ion doping is performed here using diborane ($B_2H_6$), so that the respective impurity regions have the impurity concentration of $2 \times 10^{20}$ to $2 \times 10^{21}$ atoms/cm$^3$.

Impurity regions are formed in the respective island shape semiconductor layers by the above processes. The third shaped conductive layers 5037 to 5041 overlapping the island shape semiconductor layers function as gate electrodes. The reference numeral 5042 functions as an island shape source signal line.

A process of activating the impurity elements added to the respective island shape semiconductor layers is then performed with the aim of controlling conductivity type after removing the resist mask 5200. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 5. However, for cases in which the wiring material used in the third conductive layers 5037 to 5042 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

Figures 16A, 16B:
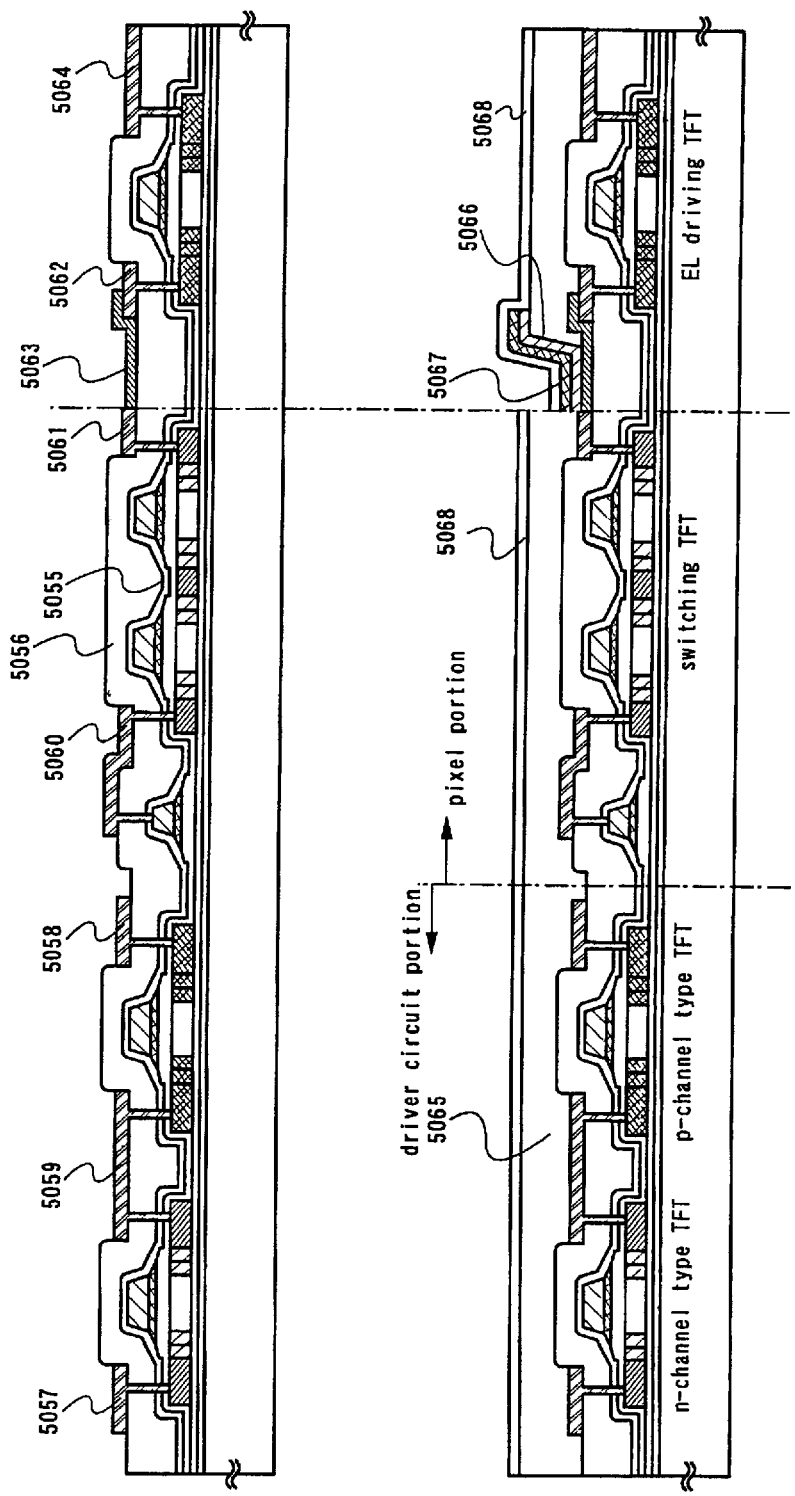
FIGS. 16A and 16B are diagrams showing the exemplary process of manufacturing an electronic device in accordance with Embodiment 5 of the present invention.

As shown in FIG. 16A, a first interlayer insulating film 5055 is formed next of a silicon oxynitride film having a thickness of 100 to 200 nm. A second interlayer insulating film 5056 made of an organic insulating material is then formed on the first interlayer insulating film 5055. After that, the first interlayer film, the second interlayer 5056 and the contact hole for the gate insulating film 5007 are formed. The pixel electrode 5063 which is contact to the connect wiring 5062 is patterned to formed after forming each wirings (including connect wiring and signal wiring) 5057 to 5062 and 5064.

As the second interlayer insulating film 5056, a film made of organic resin is used, and as the organic resin, polyimide, polyamide, acrylic, BCB (benzocyclobutene) or the like can be used. Especially, since the second interlayer insulating film 5056 has rather the meaning of flattening, acrylic excellent in flatness is desirable. In this embodiment, an acrylic film is formed to such a thickness that stepped portions formed by the TFTs can be adequately flattened. It is appropriate that the thickness is preferably made 1 to 5 $\mu$m (most preferably 2 to 4 $\mu$m).

The formation of the contact holes are performed by dry etching or wet etching. Contact holes reaching the n-type impurity regions 5017, 5018, 5021 and 5023 or the p-type impurity regions 5043 to 5054, a contact hole reaching to a wiring 5042, a contact hole reaching electric current supply line (not shown), and a contact hole (not shown) reaching a gate electrode are formed, respectively.

Besides, as the wirings (inclusive of connection line and signal line) 5057 to 5062, and 5064, a lamination film of three-layer structure is used, in which a Ti film with a thickness of 100 nm, an aluminum film containing Ti with a thickness of 300 nm, and a Ti film with a thickness of 150 nm are continuously formed by sputtering into one is patterned into a desired shape. Of course, the other conductive film may be used.

Further, in Embodiment 5, an ITO film with a thickness of 110 nm is formed as a pixel electrode 5063, and then subjected to patterning. A contact is obtained by arranging the pixel electrode 5063 so as to overlap with the connection wiring 5062 while contacting therewith. Besides, a transparent conductive film in which 2 to 20% of zinc oxide is mixed with indium oxide may be used. This pixel electrode 5063 becomes an anode of an EL element (FIG. 16A).

Then, as shown in FIG. 16B, an insulating film containing silicon (silicon oxide film in Embodiment 5) is formed into a thickness of 500 nm, and an opening is formed at a position corresponding to the pixel electrode 5063 to form the third interlayer insulating film 5065. Upon the formation of the opening, taper-shape side walls can easily be formed by using a wet etching method. If the side walls of the opening is sufficiently smooth, degradation of the EL layer caused by the step becomes a remarkable problem.

Then, an EL layer 5066 and a cathode (MgAg electrode) 5067 are continuously formed by vapor deposition without exposing them to the atmosphere. Note that the thickness of the EL layer 5066 is preferably set as 80 to 200 nm (typically 100 to 120 nm), and the thickness of the cathode 5067 is preferably set as 180 to 300 nm (typically 200 to 250 nm).

In this step, the EL layer and the cathode are sequentially formed with respect to the pixels corresponding to a red color, a green color, and a blue color, respectively. Note that, the EL layer lacks withstand property against solutions, and therefore the respective colors must be formed individually without using a photolithography technology. For that reason, it is preferred that portions other than desired pixels are masked using metallic masks, and the EL layer and the cathode are selectively formed only for the necessary portions.

In other words, a mask for masking all the portions except the pixels corresponding to a red color is first set, and the EL layer emitting a red color and the cathode are selectively formed using the mask. Then, a mask for masking all the portions except the pixels corresponding to a green color is set, and the EL layer emitting a green color and the cathode are selectively formed using the mask. Succeedingly, similarly, a mask for masking all the portions except the pixels corresponding to a blue color is set, and the EL layer emitting a blue color and the cathode are selectively formed using the mask. Note that, in this case, a description is made such that a different mask is used for each case, however, the same mask may be used for all the cases.

Employed in this case is a system in which three kinds of EL elements corresponding to RGB are formed. However, the following systems may be used: a system in which an EL element emitting a white color and a color filter are combined; a system in which an EL element emitting a blue or blue-green color and a fluorescing body (fluorescing color conversion layer: CCM) are combined; and a system in which a transparent electrode is used for a cathode (opposing electrode) and an EL element corresponding to the RGB is overlapped therewith.

Note that known materials may be used for the EL layer 5086. As the known materials, organic materials are preferably used when taking a driver voltage into an account. For example, a four-layer structure consisting of a positive hole injection layer, a positive transportation layer, a light emitting layer, and an electron injection layer may be used as the EL layer.

Next, the cathode 5067 is formed using a metal mask on the pixels having the switching TFTs of which the gate electrodes are connected to the same gate signal line (pixels on the same line). Note that, in Embodiment 5, although MgAg is used as the cathode 5067, the present invention is not limited to this. Other known materials may be used for the cathode 5067.

Finally, a passivation film 5068 made from a silicon nitride film is formed into a thickness of 300 nm. By forming the passivation film 5068, the EL layer 5066 can be protected from moisture, etc., and the reliability of the EL element may be enhanced.

Consequently, the EL display with the structure as shown in FIG. 16B is completed. Note that, in the manufacturing process of the EL display in Embodiment 5, the source signal lines are formed from Ta and W, which are materials for forming gate electrodes, and the gate signal lines are formed from Al, which is a material for forming wirings, but different materials may be used.

Incidentally, the EL display in Embodiment 5 exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 5, the active layer of the n-channel TFT contains the source region, the drain region, the LDD region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the n-channel TFT forming the CMOS circuit preferably has an Lov region. A circuit such as the transmission gate used in dot-sequential drive can be given as an example of such.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 16B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as an electronic device throughout this specification.

Furthermore, in accordance with the process shown in Embodiment 5, the number of photo masks required for manufacture of an electronic device can be suppressed. As a result, the process can be shortened, and the reduction of the manufacturing cost and the improvement of the yield can be attained.

Embodiment 6

An example of manufacturing an electronic device having a driver circuit of the present invention is explained in Embodiment 6.

Figure 17A:
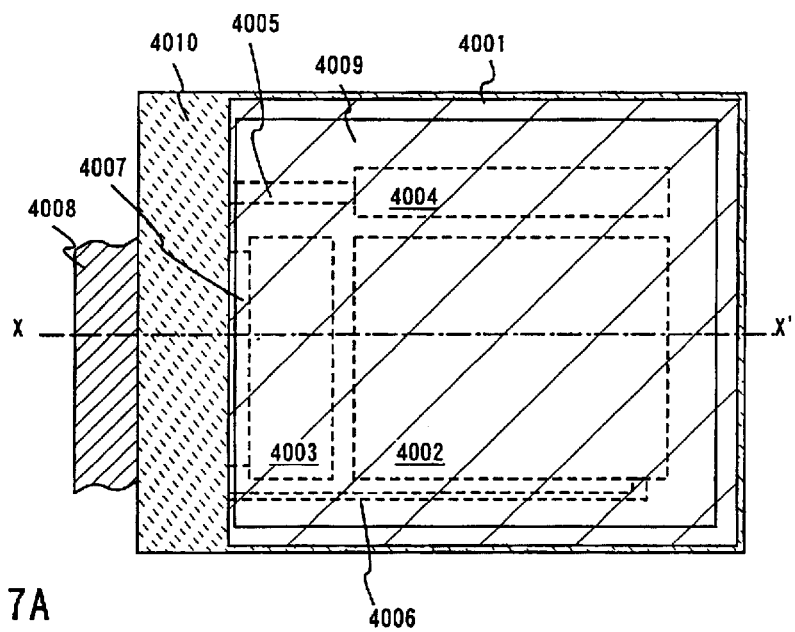
Figure 17B:
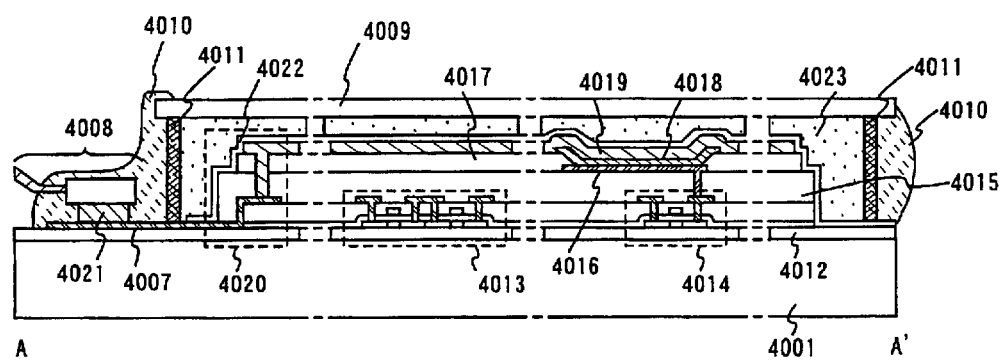

FIG. 17A is a top surface diagram of an electronic device using the present invention. The cross sectional view of FIG. 17A taking along the line of X–X' is shown in FIG. 17B. In FIG. 17A, reference numeral 4001 denotes a substrate, while reference numeral 4002 denotes a pixel portion, 4003 denotes a source signal line driver circuit, and 4004 denotes a gate signal line driver circuit. The respective driver circuits are connected to an external equipment via wirings 4005, 4006, and 4007 leading to an FPC 4008.

In the pixel portion 4002, a cover material 4009, an airtight sealing material 4010, and a sealing material (also referred to as a housing material) 4011 (shown in FIG. 9B) are formed at this time so as to surround at least the pixel portion, and preferably the driver circuit and the pixel portion.

Further, FIG. 17B is a cross sectional structure of the electronic device of Embodiment 6, and a driver circuit TFT (note that a CMOS circuit in which an n-channel TFT and a p-channel TFT are combined is shown in the figures here) 4013 and a pixel portion TFT 4014 (note that only an EL driver TFT for controlling the electric current to the EL element is shown in the figures here) are formed on a base film 4012 on the substrate 4001. Known structures (top gate structures or bottom gate structures) may be used for these TFTs.

After completing the driver circuit TFT 4013 and the pixel portion TFT 4014 by using a known method of manufacturing, a pixel electrode 4016 made from a transparent conducting film for electrically connecting to a drain of the pixel portion TFT 4014 is formed on an interlayer insulating film (leveling film) 4015 made from a resin material. A compound of indium oxide and tin oxide (referred to as ITO) and a compound of indium oxide and zinc oxide can be used as the transparent conducting film. An insulating film 4017 is formed once the pixel electrode 4016 is formed, and an open portion is formed on the pixel electrode 4016.

An EL layer 4018 is formed next. A lamination structure of a known EL material (hole injecting layer, hole transporting layer, light emitting layer, electron transporting layer, and electron injecting layer), or a single layer structure, may be used for the EL layer 4018. Further, there are low molecular weight materials and high molecular weight materials (polymer materials) for the EL material. An evaporation method is used when a low molecular weight material is used, but it is possible to use a simple method such as printing or spin coating of ink-jet printing when a high molecular weight material is used.

The EL layer is formed by evaporation using a shadow mask in Embodiment 6. Color display becomes possible by forming light emitting layers (a red color light emitting layer, a green color light emitting layer, and a blue color light emitting layer) capable of emitting light at different wavelength for each pixel using the shadow mask. In addition, a method of combining a color changing layer (CCM) and a color filter, and a method of combining a white color light emitting layer and a color filter are available, and both may be used. Of course, a single color light emitting electronic device can also be made.

After forming the EL layer 4018, a cathode 4019 is formed on the EL layer. It is preferable to remove as much moisture and oxygen as possible from the interface between the cathode 4019 and the EL layer 4018. A method in which the EL layer 4018 and the cathode 4019 are formed in succession within a vacuum, or in which the EL layer 4018 is formed in an inert environment and the cathode 4019 is then formed without exposure to the atmosphere is therefore necessary. The above film formation can be performed by using a multi-chamber method (cluster tool method) film formation apparatus.

Note that a lamination structure of a LiF (lithium fluoride) film and an Al (aluminum) film is used as the cathode 4019 in Embodiment 6. Specifically, a 1 nm thick LiF (lithium fluoride) film is formed by evaporation on the EL layer 4018, and a 300 nm thick aluminum film is formed on the LiF film. An MgAg electrode, which is a known cathode material, may of course also be used. The cathode 4019 is then connected to the wiring 4007 in a region denoted by reference numeral 4020. The wiring 4007 is an electric power source supply line for applying a predetermined voltage to the cathode 4019, and is connected to the FPC 4008 through a conducting paste material 4021.

The cathode 4019 and the wiring 4007 are electrically connected in the region shown by reference numeral 4020, and therefore it is necessary to form contact holes in the interlayer insulating film 4015 and in the insulating film 4017. These contact holes may be formed during etching of the interlayer insulating film 4015 (when the pixel electrode contact hole is formed) and during etching of the insulating film 4017 (when forming the open portion before forming the EL layer). Further, etching may also be performed together through to the interlayer insulating film 4015 when etching the insulating film 4017. A contact hole having a good shape can be formed in this case provided that the interlayer insulating film 4015 and the insulating film 4017 are formed by the same resin material.

A passivation film 4022, a filler material 4023 and the cover material 4009 are formed covering the surface of the EL element thus formed.

In addition, the sealing material 4011 is formed on the inside of the cover material 4009 and the substrate 4001 so as to surround the EL element portion. The airtight sealing material (the second sealing material) 4010 is formed on the outside of the sealing material 4011.

The filler material 4023 functions as an adhesive for bonding the cover material 4009. PVC (polyvinyl chloride), epoxy resin, silicone resin, PVB (polyvinyl butyral) and EVA (ethylene vinyl acetate) can be used as the filler material 4023. A moisture absorption effect can be maintained if a drying agent is formed on the inside of the filler material 4023, and therefore it is preferable to do so. Further, deterioration of the EL layer may be suppressed by arranging a material such as an oxidation preventing agent having an oxygen capturing effect inside the filler material 4023.

Furthermore, spacers may be included within the filler material 4023. The spacers may be made from a powdered substance composed of a material such as BaO, giving the spacers themselves moisture absorbency.

The passivation film 4022 can relieve the spacer pressure for cases of forming the spacers. Further, a film such as a resin film, separate from the passivation film, may also be formed for relieving the spacer pressure.

Further, a glass plate, an aluminum plate, a stainless steel plate, an FRP (fiberglass-reinformed plastic) plate, a PVF (polyvinyl fluoride) film, a mylar film, a polyester film, and an acrylic film can be used as the cover material 4009. Note that when using PVB or EVA as the filler material 4023, it is preferable to use a sheet having a structure in which several 10 of nm of aluminum foil is sandwiched by a PVF film or a mylar film (as the cover material 4009).

Note that, depending upon the direction of light emitted from the EL elements (light emission direction), it may be necessary for the cover material 4009 to have light transmitting characteristics.

Further, the wiring 4007 is electrically connected to the FPC 4008 through a gap between the sealing material 4011 and the airtight sealing material 4010, and the substrate 4001. Note that, although the wiring 4007 is explained here, the other wirings 4005 and 4006 are also electrically connected to the FPC 4008 by passing under the sealing material 4011 and the airtight sealing material 4010.

Note that the cover material 4009 is bonded after forming the filler material 4023 in Embodiment 6, and that the sealing material 4011 is attached so as to the side surface (exposed surface) of the filler material 4023, but the filler material 4023 may also be formed after attaching the cover material 4009 and the sealing material 4011. A filler material injection port passing through the gap formed by the substrate 4001, the cover material 4009 and the sealing material 4011 is formed in this case. The gap is then placed in a vacuum state (equal to or less than $10^{-2}$ torr), and after immersing the injection port in a tank containing the filler material, the pressure on the outside of the gap is made higher than the pressure within the gap, and the filler material fills the space.

Embodiment 7

Figure 18:
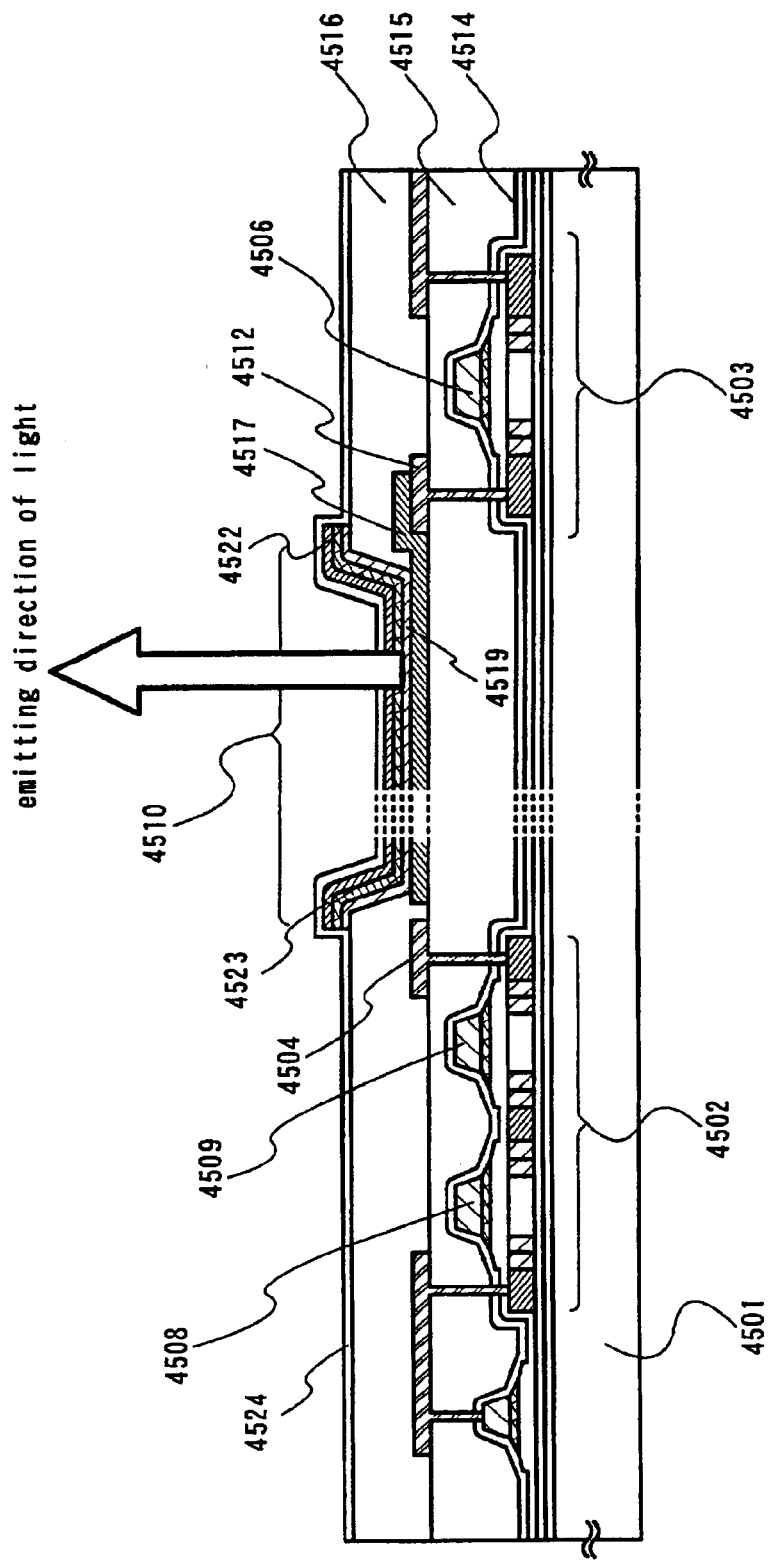
FIG. 18 is a sectional view of an electronic device according to Embodiment 7.

FIG. 18 shows a more detailed cross-sectional structure of the pixel portion of electronic device of the present invention.

In FIG. 18, a TFT 4502 for switching provided on a substrate 4501 is formed by using the n-channel type TFT forming by a known method in this embodiment. In this embodiment, the TFT has a double-gate structure. Since there is no substantial difference in its structure and production process, its description will be omitted. Due to the double-gate structure, there is an advantage in that substantially two TFTs are connected in series to reduce an OFF current value. In this embodiment, the TFT has a double-gate structure; however, it may have a single gate structure, a triple gate structure, or a multi-gate structure having 4 or more gates.

An EL driver TFT 4503 is formed by using the n-channel type TFT of the present invention. A drain wiring 4504 of the switching TFT 4502 is electrically connected to a gate electrode 4506 of the EL driver TFT 4503 by a wiring (not shown in the figure).

Furthermore, in this embodiment, the EL driver TFT 4503 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

A line to be the gate electrode 4506 of the EL driver TFT 4503 overlaps a drain wiring 4512 of the EL driver TFT 4503 via an insulating film in a region. In the region, a capacitor is formed. The capacitor functions for holding a voltage applied to a gate electrode 4506 of the EL driver TFT 4503.

A first interlayer insulating film 4514 is provided on the switching TFT 4502 and the EL driver TFT 4503, and a second interlayer insulating film 4515 that is made of a resin insulating film is formed thereon.

Reference numeral 4517 denotes a pixel electrode (cathode of an EL element) that is made of a conductive film with high reflectivity and is electrically connected to the drain region of the EL driver TFT 4503. As the pixel electrode 4517, a low resistant conductive film such as an aluminum alloy film, a copper alloy film, and a silver alloy film, or a layered structure thereof can be preferably used. Needless to say, a layered structure with other conductive films may also be used.

Next, a light-emitting layer 4519 is formed after an organic resin film 4516 is formed on the pixel electrode 4517 and portion which is facing the pixel electrode 4517 is patterned. Herein, not shown in the figure; however, light-emitting layers corresponding to each color (red), G (green), and B (blue)) may be formed. As an organic EL material for the light-emitting layer, a π-conjugated polymer material is used. Examples of the polymer material include polyparaphenylene vinylene (PPV), polyvinyl carbazole (PVK), and polyfluorene.

There are various types of PPV organic EL materials. For example, materials as described in H. Shenk, H. Becker, O. Gelsen, E. Kluge, W. Kreuder and H. Spreitzer, Polymers for Light Emitting Diodes, Euro Display, Proceedings, 1999, pp. 33–37 and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a charge-transporting layer, or a charge injection layer may be appropriately combined to form an EL layer (for light emitting and moving carriers therefor).

For example, in this embodiment, the case where a polymer material is used for the light-emitting layer has been described. However, a low molecular-weight organic EL material may be used. Furthermore, an inorganic material such as silicon carbide can also be used for a charge-transporting layer and a charge injection layer. As these organic EL materials and inorganic materials, known materials can be used.

When the anode 4523 is formed, the EL element 4510 is completed. The EL element 4510 refers to a capacitor composed of the pixel electrode (cathode) 4517, the light-emitting layer 4519, the hole injection layer 4522, and the anode 4523.

In this embodiment, a passivation film 4524 is further formed on the anode 4523. As the passivation film 4524, a silicon nitride film or a silicon oxynitride film is preferably used. The purpose of the passivation film 4524 is to prevent the EL element from being exposed to the outside. That is, the passivation film 4524 protects an organic EL material from degradation due to oxidation, and suppresses the release of gas from the organic EL material. Because of this, the reliability of the electronic device is enhanced.

As described above, the electronic device of the present invention has a pixel portion made of a pixel with a structure as shown in FIG. 18, and includes a switching TFT having a sufficiently low OFF current value and an EL driver TFT that is strong to the injection of hot carriers. Thus, an electronic device is obtained, which has high reliability and is capable of displaying a satisfactory image.

In the case that EL element has a structure explained in this embodiment, light generated by the light-emitting layer 4519 is irradiated toward reverse direction to the substrate on which a TFT is formed as represented by an arrow.

Embodiment 8

Embodiment 8 describes a modified structure for the pixel portion of Embodiment 7 shown in FIG. 18, in which the EL element 4510 is given the reverse structure. The description will be made with reference to FIG. 19. The structure of FIG. 19 is different from the structure of FIG. 18 regarding only the EL element and the TFT, and hence the description on the other parts will be omitted.

Figure 19:
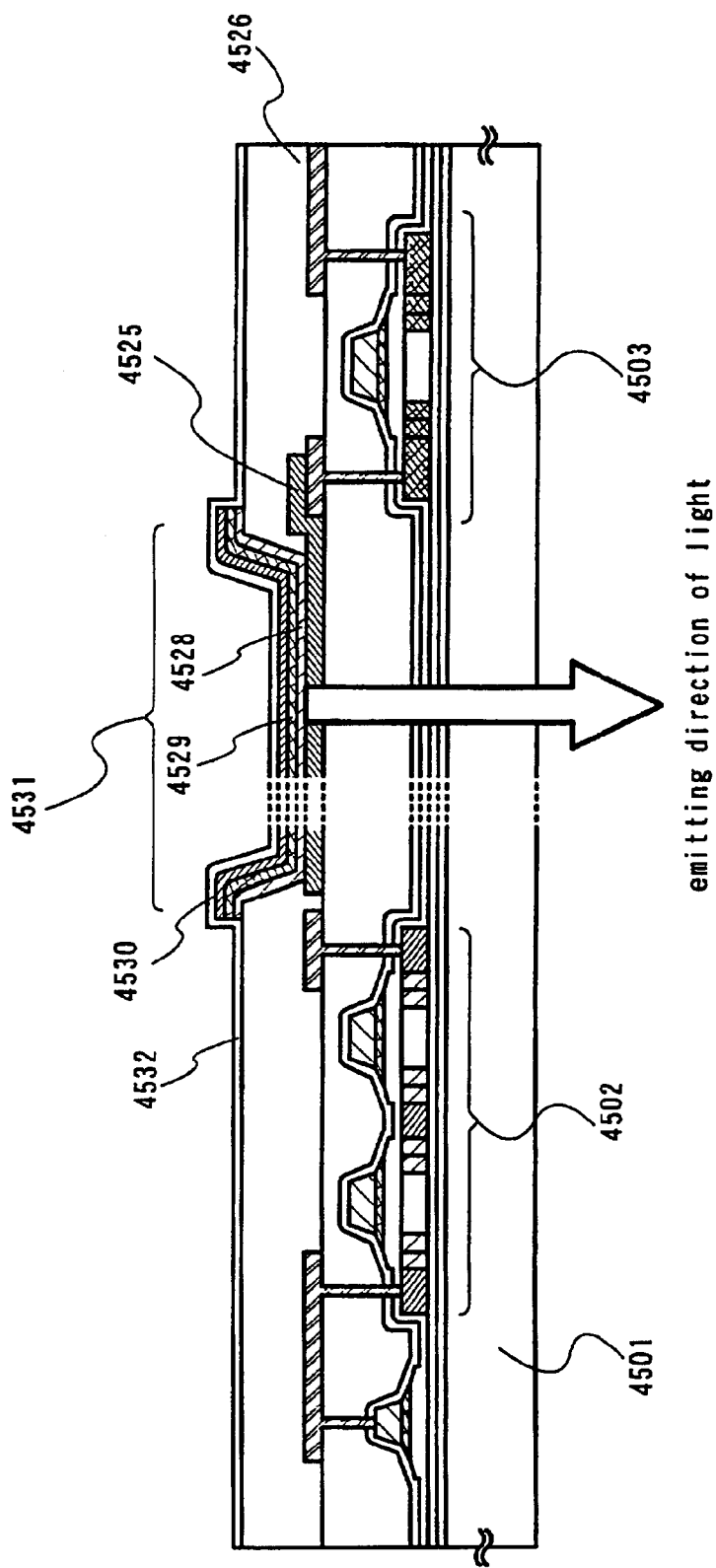
FIG. 19 is a sectional view of an electronic device according to Embodiment 8.

In FIG. 19, an n-channel TFT formed by a known method is used for the switching TFT 4502 and a p-channel TFT formed by a known method is used for the EL driver TFT 4503.

A transparent conductive film is used for a pixel electrode (anode) 4525 in Embodiment 8. Specifically, a conductive film comprised of a compound of indium oxide and zinc oxide is used. A conductive film comprised of a compound of indium oxide and tin oxide may of course be used instead.

A third interlayer insulating film 4526 is formed from a resin film and then a light emitting layer 4528 is formed. On the light emitting layer, an electron injecting layer 4529 and a cathode 4530 are formed from potassium acetylacetonate (expressed as acacK) and an aluminum alloy, respectively.

Thereafter, similar to Embodiment 7, a passivation film 4532 is formed to prevent oxidization of the organic EL material. An EL element 4531 is thus completed.

In the case of the EL element having the structure described in Embodiment 8, the light generated in the light emitting layer 4528 is emitted toward a substrate on which the TFTs are formed as indicated by the arrow in FIG. 19.

Embodiment 9

The electronic devices shown in Embodiments 7 and 8 can readily be formed also when reverse stagger type TFTs are used for the TFTs constituting the driver circuits. The description will be given with reference to FIG. 20. The components of Embodiment 9, which are common with the components in Embodiments 7 and 8, are denoted by the same reference symbols as those in FIGS. 18 and 19.

Figure 20:
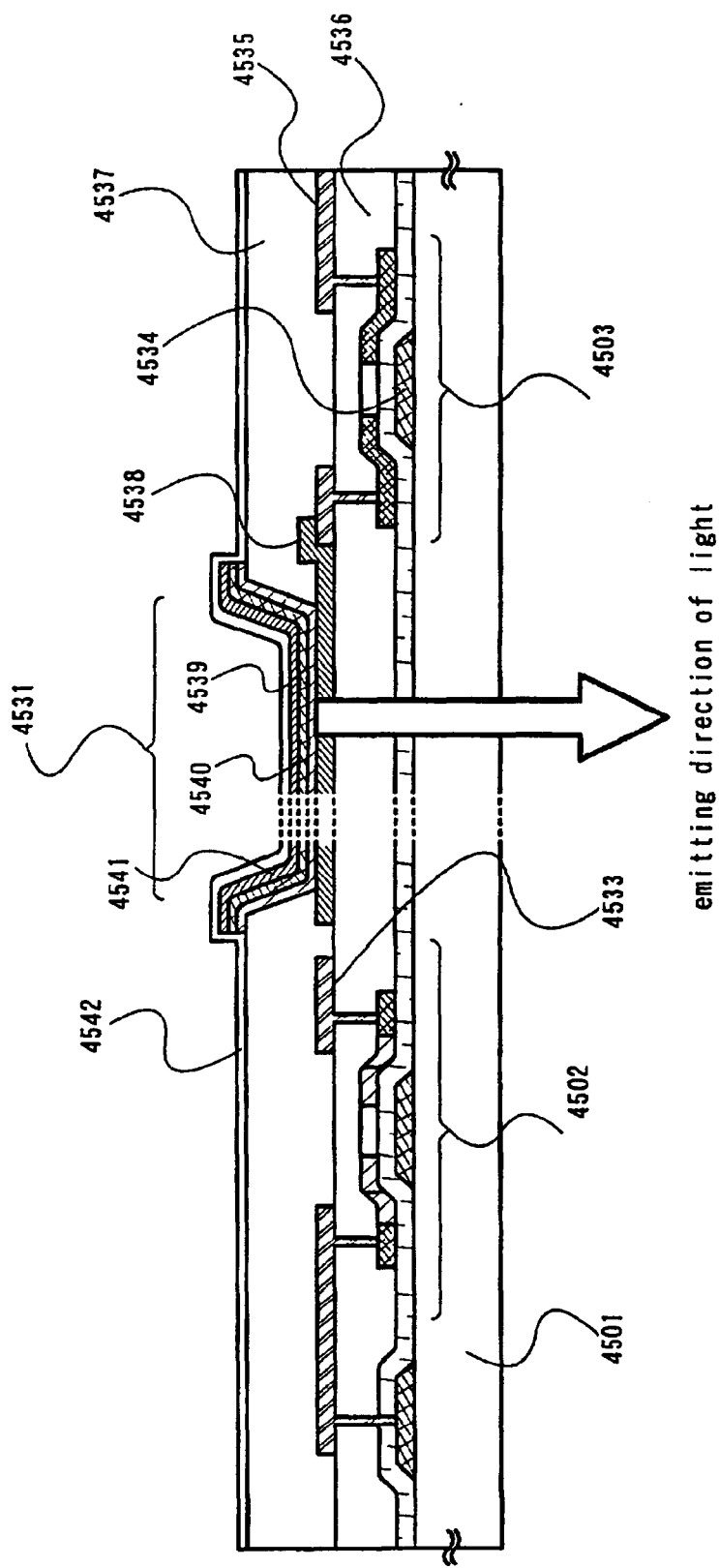
FIG. 20 is a sectional view of an electronic device according to Embodiment 9.
Figure 21:
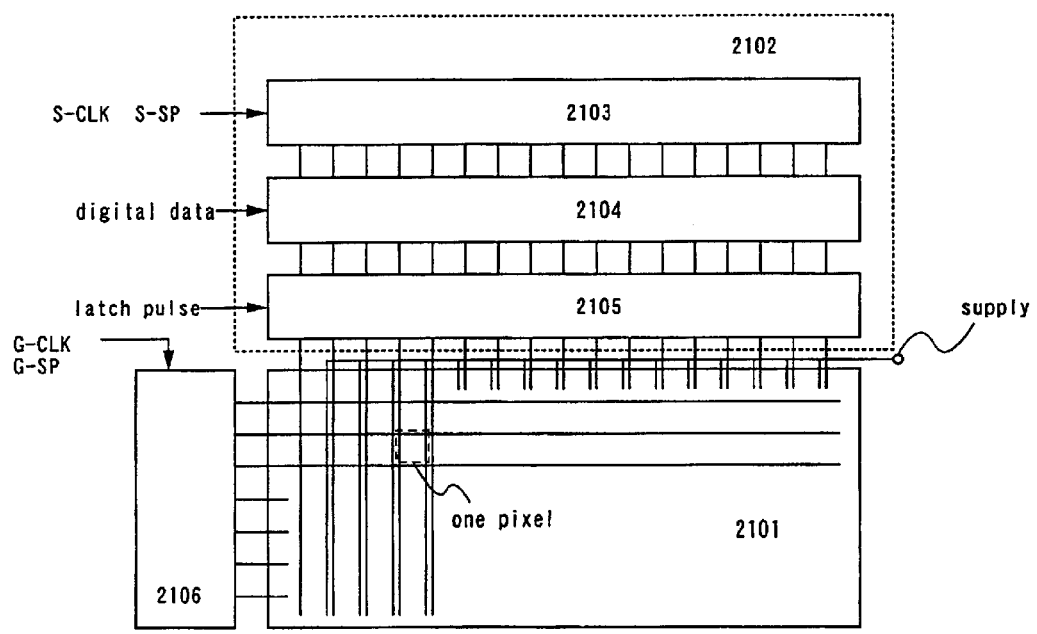
FIG. 21 is a diagram showing an example of the circuit structure of an electronic device.

In FIG. 20, an n-channel TFT formed by a known method is used for the switching TFT 4502 that is provided on the substrate 4501 in Embodiment 9. The switching TFT of Embodiment 9 has a single gate structure but may have a double gate structure, a triple gate structure, or a multi-gate structure with more than three gates. The switching TFT 4502 has LDD regions on the source region side and on the drain region side, with one overlapping the gate electrode and the other not overlapping the gate electrode. However, the switching TFT may not have any LDD region.

A p-channel TFT formed by a known method is used for the EL driver TFT 4503. The switching TFT 4502 has a drain wiring 4533 electrically connected through a not-shown wiring to a gate electrode 4534 of the EL driver TFT 4503.

The EL driver TFT 4503 of Embodiment 9 is illustrated as a TFT having a single gate structure. However, it may have a multi-gate structure in which a plurality of TFTs are connected in series. Alternatively, it may have a structure in which a plurality of TFTs are connected in parallel to substantially divide the channel forming region into plural regions so that heat can be released with high efficiency. This structure is effective as a measure against degradation by heat.

A wiring (not shown) including the gate electrode 4534 of the EL driver TFT 4503 partially overlaps with a source wiring 4535 of the EL driver TFT 4503 through an insulating film. The overlapped region has a storage capacitor formed therein. The storage capacitor has a function of storing the voltage applied to the gate electrode 4534 of the EL driver TFT 4503.

A first interlayer insulating film 4536 is formed on the switching TFT 4502 and the EL driver TFT 4503. A second interlayer insulating film 4537 formed from a resin insulating film is formed on the first interlayer insulating film.

Thereafter, similar to Embodiments 7 and 8, a pixel electrode (anode) 4538, a light emitting layer 4539, an electron injecting layer 4540, a cathode 4541 and a passivation film 4542 are formed to complete the EL element 4531.

In the case of the EL element having the structure described in Embodiment 9, the light generated in the light emitting layer 4539 is emitted toward the substrate on which the TFTs are formed as indicated by the arrow in FIG. 20.

Embodiment 10

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)

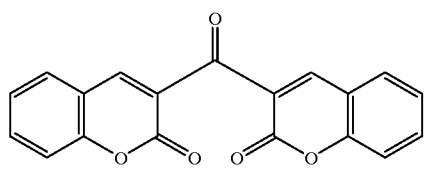

(M. A. Baldo, D. F. O' Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical Formula 2)

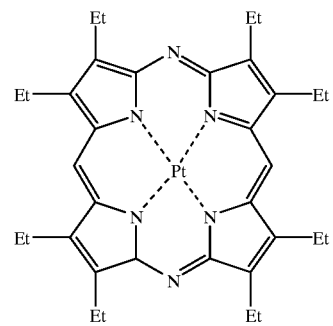

(M. A. Baldo, S. Lamansky, P. E. Burrows, M. E. Thompson, S. R. Forrest, Appl. Phys. Lett., 75 (1999) p.4.)
(T. Tsutsui, M. -J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical Formula 3)

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to ninth embodiments.

Embodiment 11

The EL display device, which is an application of driving method of electronic device of the present invention, is a self light emitting type, therefore compared to a liquid crystal display device, it has excellent visible properties and is broad in an angle of visibility. Accordingly, the EL display device can be applied to a display portion in various electronic devices. For example, in order to view a TV program or the like on a large-sized screen, the EL display device in accordance with the present invention can be used as a display portion of an EL display having a diagonal size of 30 inches or larger (typically 40 inches or larger).

The EL display includes all kinds of displays to be used for displaying information, such as a display for a personal computer, a display for receiving a TV broadcasting program, a display for advertisement display. Moreover, the driving method of electronic equipments in accordance with the present invention can be used as a display portion of other various electric devices.

As other electronic equipments of the present invention there are: a video camera; a digital camera; a goggle type display (head mounted display); a car navigation system; a car audio stereo; a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk Player (DVD), and displays the images). Specific examples of those electronic equipments are shown in FIGS. 23A to 24C.

Figure 23A:
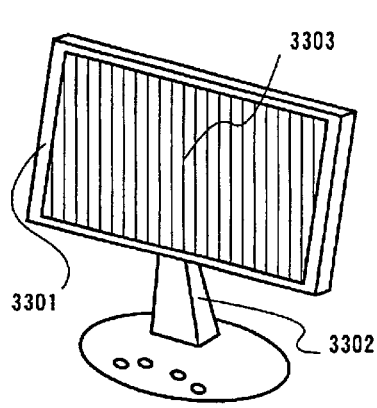
FIGS. 23A to 23F are diagrams showing examples of electronic equipment in accordance with Embodiment 11, to which an electronic device of the present invention is applied.

FIG. 23A shows an EL display containing a casing 3301, a support stand 3302, and a display portion 3303. The electronic device and the driving method of the present invention can be used as the display portion 3303. Such an EL display is a self light emitting type so that a back light is not necessary. Thus, the display portion can be made thinner than that of a liquid crystal display.

Figure 23B:
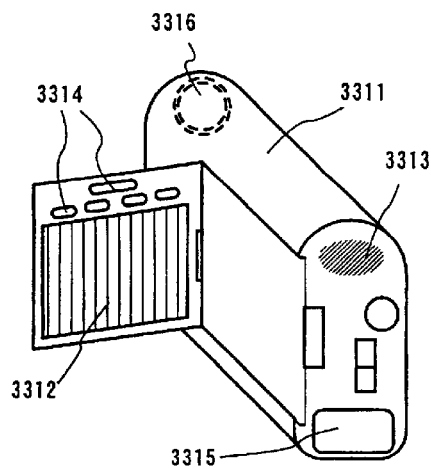

FIG. 23B shows a video camera, and contains a main body 3311, a display portion 3312, a sound input portion 3313, operation switches 3314, a battery 3315, and an image receiving portion 3316. The electronic device and the driving method of the present invention can be used as the display portion 3312.

Figure 23C:
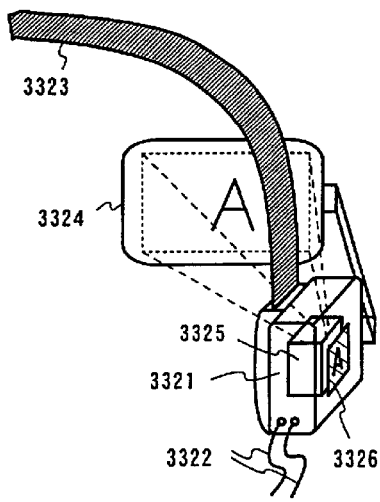

FIG. 23C shows a part of a head mounted EL display device (right handed side), and contains a main boy 3321, a signal cable 3322, a head fixciation band 3323, a display portion 3324, an optical system 3325 and a display device 3326. The electronic device and the driving method of the present invention can be used as the display device 3326.

Figure 23D:
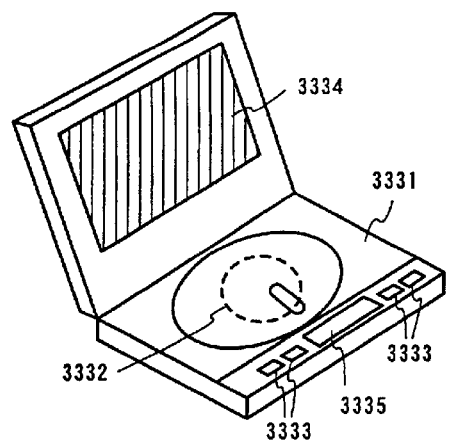

FIG. 23D is an image playback device equipped with a recording medium (specifically, a DVD playback device), and contains a main body 3331, a recording medium (such as a DVD and so forth) 3332, operation switches 3333, a display portion (a) 3334, and a display portion (b) 3335. The display portion (a) 3334 is mainly used for displaying image information. The display portion (b) 3335 is mainly used for displaying character information. The electronic device and the driving method of the present invention can be used as the display portion (a) 3334 and as the display portion (b) 3335. Note that the image playback device equipped with the recording medium includes devices such as game machines.

Figure 23E:
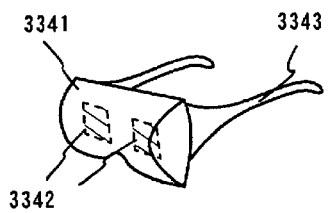

FIG. 23E shows a goggle type display device (a head mounted display device), and contains a main body 3341, a display portion 3342, and an arm portion 3343. The electronic device and the driving method of the present invention can be bused as the display portion 3342.

Figure 23F:
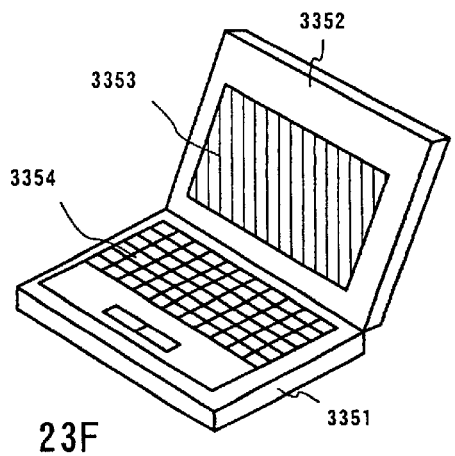

FIG. 23F is a personal computer, and contains a main body 3351, a casing 3352, a display portion 3353, and a keyboard 3354. The electronic device and the driving method of the present invention can be used as the display portion 3353.

Note that if the luminance of EL material increases in the future, then it will become possible to use the electronic device and the driving method of the present invention in a front type or a rear type projector by expanding and projecting light containing output image information with a lens or the like.

Further, the above electronic devices display often information transmitted through an electronic communication circuit such as the Internet and CATV (cable TV), and particularly situations of displaying moving images is increasing. The response speed of EL materials is so high that the EL display devices are good for display of moving image.

In addition, since the EL display device conserves power in the light emitting portion, it is preferable to display information so as to make the light emitting portion as small as possible. Consequently, when using the EL display device in a display portion mainly for character information, such as in a portable information terminal, in particular a portable telephone or a sound reproduction device, it is preferable to drive the light emitting device so as to form character information by the light emitting portions while non-light emitting portions are set as background.

Figure 24A:
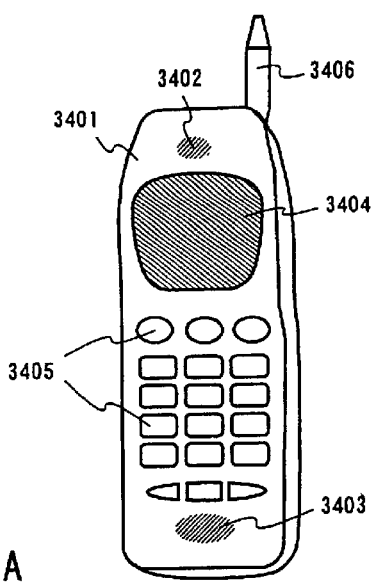
FIGS. 24A to 24C are diagrams showing examples of electronic equipment in accordance with Embodiment 11, to which an electronic device of the present invention is applied.

FIG. 24A shows a portable telephone, and contains a main body 3401, a sound output portion 3402, a sound input portion 3403, a display portion 3404, operation switches 3405, and an antenna 3406. The light emitting device of the present invention can be used as the display portion 3404. Note that by displaying white color characters in a black color background, the display portion 3404 can suppress the power consumption of the portable telephone.

Figure 24B:
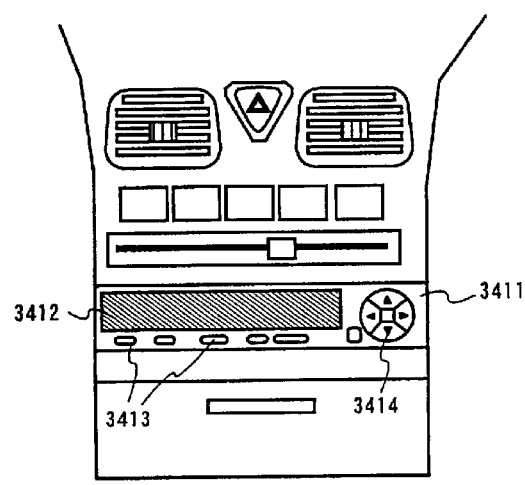

FIG. 24B shows a sound reproduction device, in a concrete term, a car audio stereo, and contains a main body 3411, a display portion 3412, and operation switches 3413 and 3414. The electronic device and the driving method of the present invention can be used as the display portion 3412. Further, a car mounting audio stereo is shown in this embodiment, but a fixed type audio playback device may also be used. Note that, the display portion 3414 can suppress the power consumption by displaying white color character in a blackcolor background, particularly in the portable sound reproduction device.

Figure 24C:
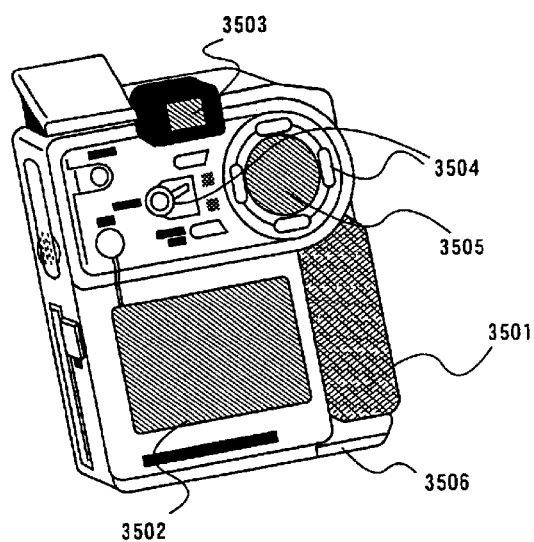

FIG. 24C shows a digital camera, and contains a main body 3501, a display portion (A) 3502, an eye piece portion 3503, and an operation switches 3504, a display portion (B) 3505, a battery 3506. The electronic device of the present invention can be used as the display portion (A) 3502 and the display portion (B) 3505. Note that, in the case that the display portion (A) 3502 is used as the operation panel, the power consumption of the digital camera can suppress by displaying white color characters in a black color background.

In the case of the portable electronic device shown in this embodiment, the sensor portion is provided as a method of lowering the power consumption, which perceives the external light and functions to lower the brightness of display when it is used in the dark.

As described above, the application range of this invention is extremely wide, and it may be used for electric devices in various fields. Further, the electronic device of this embodiment may be obtained by freely combining the structures of first to tenth embodiments.

If there are m pixels in the horizontal direction, a source signal line side driver circuit usually has m stages. By employing the structure of the present invention, the number of stages can be reduced to m/2 stages, and no problem arise regarding reliability because the invention does not need to raise the operating frequency. Therefore, the present invention can avoid the designing problem of insufficient space for placing the driver circuit which is caused by reducing the pixel pitch in order to enhance the definition of the display screen, thereby providing a great help in increasing the definition of the electronic device.

Furthermore, the total number of wirings can be reduced by sharing a source signal line between pixels in the pixel portion. The pixel portion structured as such is more advantageous in terms of aperture ratio than a pixel portion having an ordinary structure.

What is claimed is:

1. An electronic device comprising a source signal line side driver circuit, a gate signal line side driver circuit, a pixel selecting signal line side driver circuit and a pixel portion, wherein:

said pixel portion has m source signal lines, k gate signal lines and 2km pixels;

each of said m source signal lines has k pixel selecting portions;

each of said m source signal lines is electrically connected though said pixel selecting portions to 2k pixels;

said 2km pixels each has a switching transistor, an EL driving transistor and an EL element;

said switching transistor has a gate electrode electrically connected to any one of said gate signal lines;

said switching transistor has impurity regions, one of which is electrically connected to any one of said source signal lines and the other of which is electrically connected to a gate electrode of said EL driving transistor; and said EL driving transistor has impurity regions, one of which is electrically connected to a current supply line and the other of which is electrically connected to one of electrodes of said EL element.

2. An electronic device according to claim 1, wherein said source signal line side driver circuit performs image signal writing operation twice during one horizontal period on each of said m source signal lines.

3. An electronic device as according to claim 1, wherein:

a first pixel and a second pixel are electrically connected to each pixel selecting portion;

each of said pixel selecting portion selects said first pixel in the former half of one horizontal period whereas it selects said second pixel in the latter half of the horizontal period; and an image signal inputted from said source signal lines is written only in said pixel selected by said pixel selecting portion.

4. An electronic device according to claim 1, wherein each pixel selecting portion has an n-channel transistor and a p-channel transistor.

5. An electronic device according to claim 1, wherein each pixel selecting portion has an analog switch.

6. An electronic device according to claim 1, wherein said electronic device is selected form the group consisting of an EL display, a video camera, a head mounted EL display device, an image playback device, a goggle type display device, a personal computer, a portable phone, a sound reproduction device and a digital camera.

7. An electronic device comprising a source signal line side driver circuit, a gate signal line side driver circuit, a pixel selecting signal line side driver circuit and a pixel portion, wherein:

said pixel portion has m source signal lines, k gate signal lines and 2km pixels;

said 2km pixels each has a switching transistor, an EL driving transistor and an EL element;

said switching transistor has a gate electrode electrically connected to any one of said gate signal lines;

said switching transistor has impurity regions, one of which is electrically connected through a pixel selecting portion to any one of said source signal lines and the other of which is electrically connected to a gate electrode of said EL driving transistor; and said EL driving transistor has impurity regions, one of which is electrically connected to a current supply line and the other of which is electrically connected to one of electrodes of said EL element.

8. An electronic device according to claim 7, wherein said source signal line side driver circuit performs image signal writing operation twice during one horizontal period on each of said m source signal lines.

9. An electronic device as according to claim 7, wherein:

a first pixel and a second pixel are electrically connected to each pixel selecting portion;

each of said pixel selecting portion selects said first pixel in the former half of one horizontal period whereas it selects said second pixel in the latter half of the horizontal period; and an image signal inputted from said source signal lines is written only in said pixel selected by said pixel selecting portion.

10. An electronic device according to claim 7, wherein each pixel selecting portion has an n-channel transistor and a p-channel transistor.

11. An electronic device according to claim 7, wherein each pixel selecting portion has an analog switch.

12. An electronic device according to claim 7, wherein said electronic device is selected form the group consisting of an EL display, a video camera, a head mounted EL display device, an image playback device, a goggle type display device, a personal computer, a portable phone, a sound reproduction device and a digital camera.

13. A method of driving an electronic device, said electronic device obtaining n bit gray scale display by controlling the length of time an EL element to emit light when one frame period consists of n sub-frame periods $SF_1$, $SF_2$, ... and $SF_n$ and the sub-frame periods each have address (writing) periods $Ta_1$, $Ta_2$, ... and $Ta_n$ and sustain (lights-on) periods $Ts_1$, $Ts_2$, ... and $Ts_n$, wherein, if there are 2m pixels in the horizontal direction of the electronic device, one horizontal period is divided into two periods so that an image signal is written in the first, third, ..., (2m−3)-th or (2m−1)-th pixel during one of the periods whereas an image signal is written in the second, fourth, ..., (2m−2)-th or 2m-th pixel during the other period.

14. A method of driving an electronic device as claimed in claim 13, wherein the period during which an image signal is written in the first, third, ..., (2m−3)-th or (2m−1)-th pixel corresponds to the former half of one horizontal period and the period during which an image signal is written in the second, fourth, ..., (2m−2)-th or 2m-th pixel corresponds to the latter half of the horizontal period.

15. A method of driving an electronic device as claimed in claim 13, wherein the period during which an image signal is written in the first, third, ..., (2m−3)-th or (2m−1)-th pixel corresponds to the latter half of one horizontal period and the period during which an image signal is written in the second, fourth, ..., (2m−2)-th or 2m-th pixel corresponds to the former half of the horizontal period.

16. A method of driving an electronic device according to claim 13, wherein said electronic device is selected form the group consisting of an EL display, a video camera, a head mounted EL display device, an image playback device, a goggle type display device, a personal computer, a portable phone, a sound reproduction device and a digital camera.

17. An electronic device comprising:

at least a first pixel and a second pixel formed over a substrate, wherein the first pixel comprises:

a gate signal line;

a source signal line;

a first switching TFT connected to the gate signal line;

a first current supply line;

a first EL driving TFT connected to the first current supply line; and a first EL element connected to the first EL driving TFT, wherein the second pixel comprises:
  the gate signal line;
  the source signal line;
  a second switching TFT connected to the gate signal line;
  a second current supply line;
  a second EL driving TFT connected to the second supply line; and
  a second EL element connected to the second EL driving TFT,
wherein the source signal line is electrically connected to the first switching TFT or the second switching TFT in a determined period.

18. An electronic device according to claim 17, wherein the electronic device is selected form the group consisting of an EL display, a video camera, a head mounted EL display device, an image playback device, a goggle type display device, a personal computer, a portable phone, a sound reproduction device and a digital camera.

19. An electronic device comprising:
  at least a first pixel and a second pixel formed over a substrate,
  wherein the first pixel comprises:
    a gate signal line;
    a source signal line;
    a pixel selecting signal line;
    a first switching TFT connected to the gate signal line;
    a first current supply line;
    a first EL driving TFT connected to the first current supply line;
    a first EL element connected to the first EL driving TFT; and
    a first pixel selecting TFT connected to the pixel selecting signal line and the first switching TFT,
  wherein the second pixel comprises:
    the gate signal line;
    the source signal line;
    the pixel selecting signal line;
    a second switching TFT connected to the gate signal line;
    a second current supply line;
    a second EL driving TFT connected to the second supply line;
    a second EL element connected to the second EL driving TFT; and
    a second pixel selecting TFT connected to the pixel selecting line and the second switching TFT.

20. An electronic device according to claim 19, wherein the electronic device is selected form the group consisting of an EL display, a video camera, a head mounted EL display device, an image playback device, a goggle type display device, a personal computer, a portable phone, a sound reproduction device and a digital camera.

* * * * *